US009825166B2

(12) United States Patent
Tega et al.

(10) Patent No.: US 9,825,166 B2
(45) Date of Patent: Nov. 21, 2017

(54) SILICON CARBIDE SEMICONDUCTOR DEVICE AND METHOD FOR PRODUCING SAME

(71) Applicant: HITACHI, LTD., Chiyoda-ku, Tokyo (JP)

(72) Inventors: Naoki Tega, Tokyo (JP); Digh Hisamoto, Tokyo (JP); Satoru Akiyama, Tokyo (JP); Takashi Takahama, Tokyo (JP); Tadao Morimoto, Tokyo (JP); Ryuta Tsuchiya, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 14/760,166

(22) PCT Filed: Jan. 23, 2013

(86) PCT No.: PCT/JP2013/051233
§ 371 (c)(1),
(2) Date: Jul. 9, 2015

(87) PCT Pub. No.: WO2014/115253
PCT Pub. Date: Jul. 31, 2014

(65) Prior Publication Data
US 2015/0349115 A1    Dec. 3, 2015

(51) Int. Cl.
*H01L 29/78* (2006.01)
*H01L 21/265* (2006.01)
(Continued)

(52) U.S. Cl.
CPC .... *H01L 29/7813* (2013.01); *H01L 21/02529* (2013.01); *H01L 21/047* (2013.01);
(Continued)

(58) Field of Classification Search
CPC ............. H01L 29/7813; H01L 29/0523; H01L 29/66068; H01L 29/66734; H01L 29/0619
See application file for complete search history.

(56) References Cited

U.S. PATENT DOCUMENTS 6,180,958 B1    1/2001    Cooper, Jr.
6,969,887 B2    11/2005    Mizukami et al.
(Continued)

FOREIGN PATENT DOCUMENTS

| JP | 4577355 B2 | 7/2009 |
|---|---|---|
| JP | 2009-260064 A | 11/2009 |
| JP | 2009-260253 A | 11/2009 |
| JP | 4564362 B2 | 8/2010 |
| JP | 2011-101036 A | 5/2011 |

(Continued)

OTHER PUBLICATIONS

Office Action for related apanese Application No. 2014-558322 (dated Dec. 1, 2015).

*Primary Examiner* — Matthew Reames
(74) *Attorney, Agent, or Firm* — Miles & Stockbridge P.C.

(57) ABSTRACT

Disclosed herein is a technique for realizing a high-performance and high-reliability silicon carbide semiconductor device. A trenched MISFET with a trench formed into the drift through a p-type body layer 105 includes an n-type resistance relaxation layer 109 covering the bottom portion of the trench, and a p-type field relaxation layer 108. The p-type field relaxation layer 108 is separated from the trench bottom portion via the resistance relaxation layer 109, and is wider than the resistance relaxation layer 109. This achieves a low ON resistance, high reliability, and high voltage resistance at the same time. By forming the field relaxation layer beneath the trench, feedback capacitance can be controlled to achieve a high switching rate and high reliability.

19 Claims, 22 Drawing Sheets

(51) Int. Cl.
   *H01L 21/02*   (2006.01)
   *H01L 21/04*   (2006.01)
   *H01L 29/66*   (2006.01)
   *H01L 29/08*   (2006.01)
   *H01L 29/16*   (2006.01)
   *H01L 29/10*   (2006.01)
   *H01L 29/06*   (2006.01)

(52) U.S. Cl.
   CPC .... *H01L 21/26513* (2013.01); *H01L 29/0623* (2013.01); *H01L 29/0878* (2013.01); *H01L 29/66068* (2013.01); *H01L 29/66734* (2013.01); *H01L 29/0619* (2013.01); *H01L 29/0661* (2013.01); *H01L 29/1095* (2013.01); *H01L 29/1608* (2013.01); *H01L 29/7811* (2013.01)

(56) References Cited

U.S. PATENT DOCUMENTS

| | | | |
|---|---|---|---|
| 7,851,854 B2 | 12/2010 | Okuno et al. | |
| 7,994,513 B2 | 8/2011 | Yamamoto et al. | |
| 8,193,564 B2 | 6/2012 | Suzuki et al. | |
| 8,283,721 B2 | 10/2012 | Nakano | |
| 8,618,555 B2 * | 12/2013 | Suzuki | H01L 29/1095 257/77 |
| 8,952,430 B2 | 2/2015 | Takaya et al. | |

FOREIGN PATENT DOCUMENTS

| | | |
|---|---|---|
| JP | 2012-019188 A | 1/2012 |
| JP | 2012-169385 A | 9/2012 |
| WO | WO 2012/108165 A1 | 8/2012 |

* cited by examiner

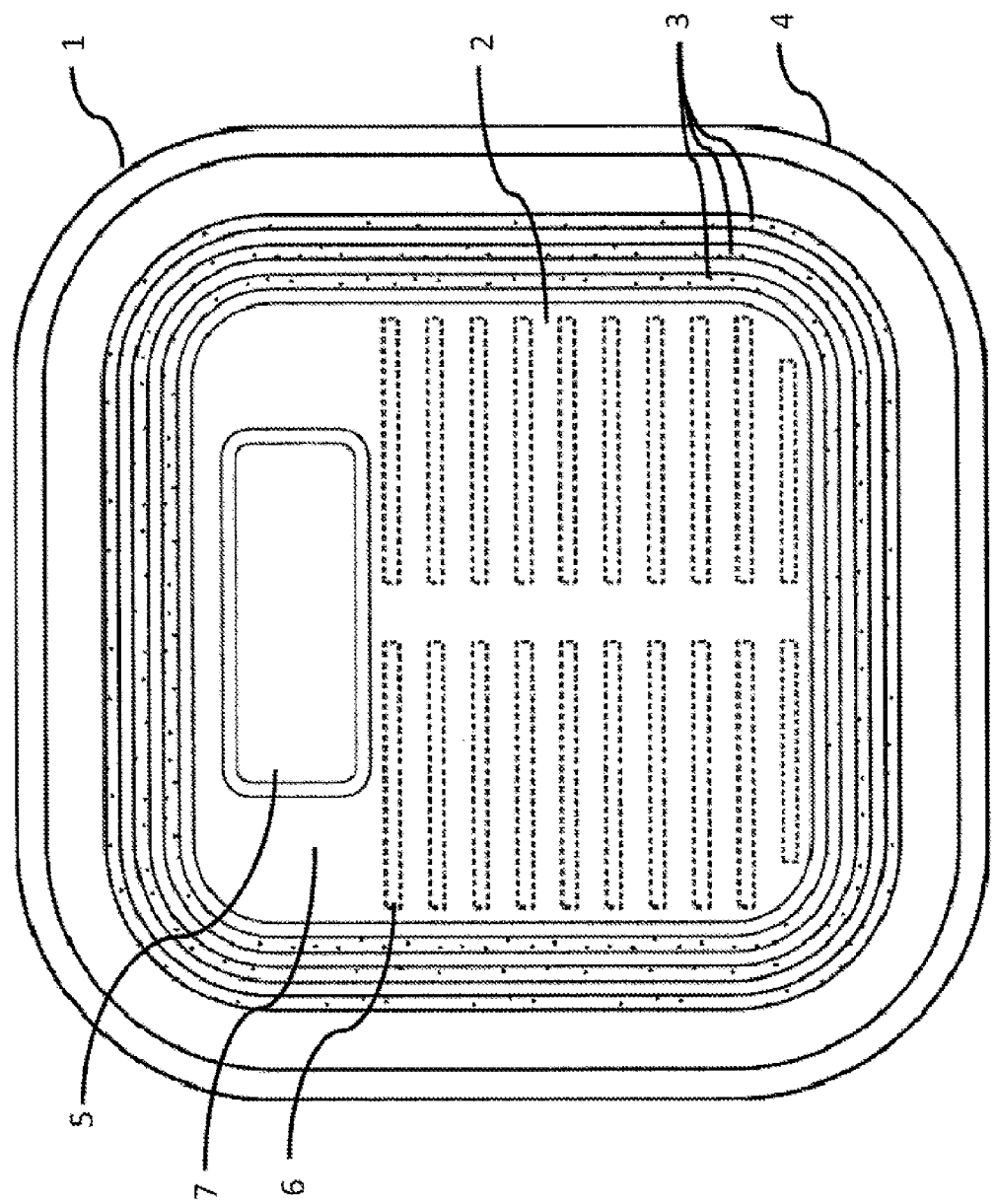
[FIG. 1]

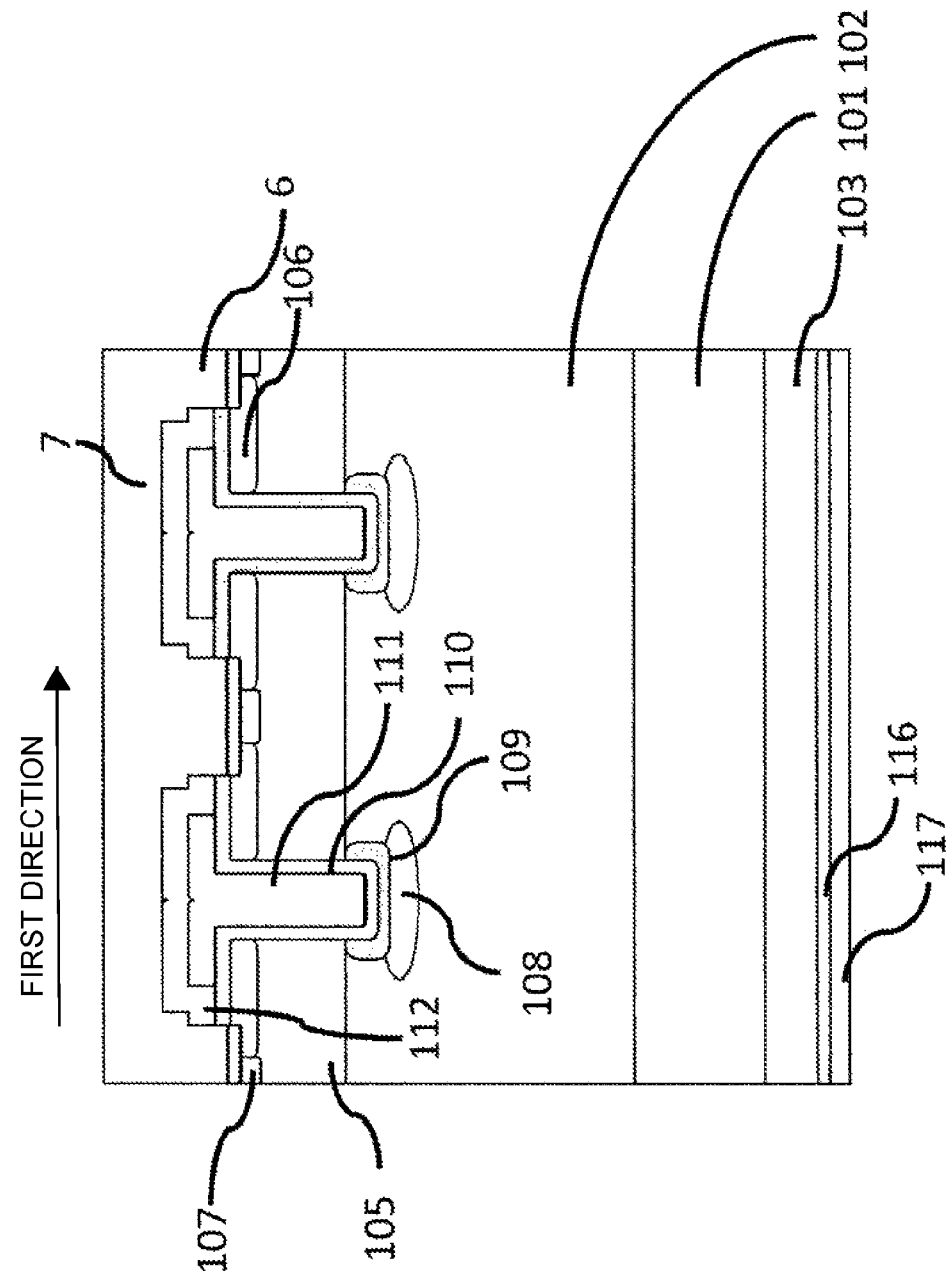

[FIG. 3]
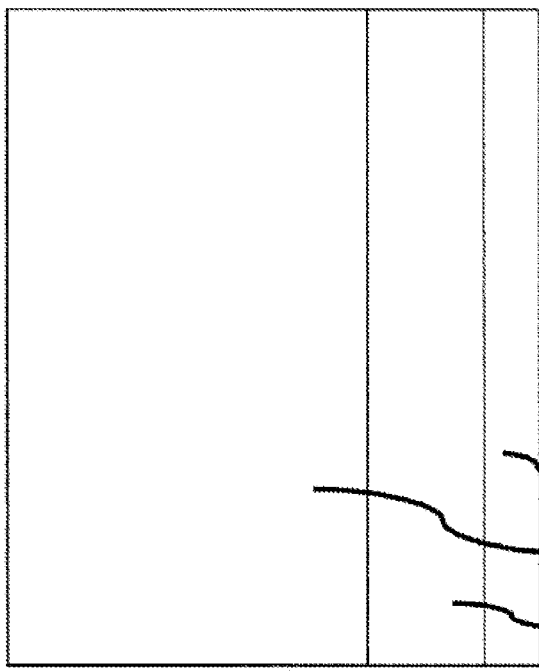
(a) PERIPHERY FORMING REGION
101 102 103
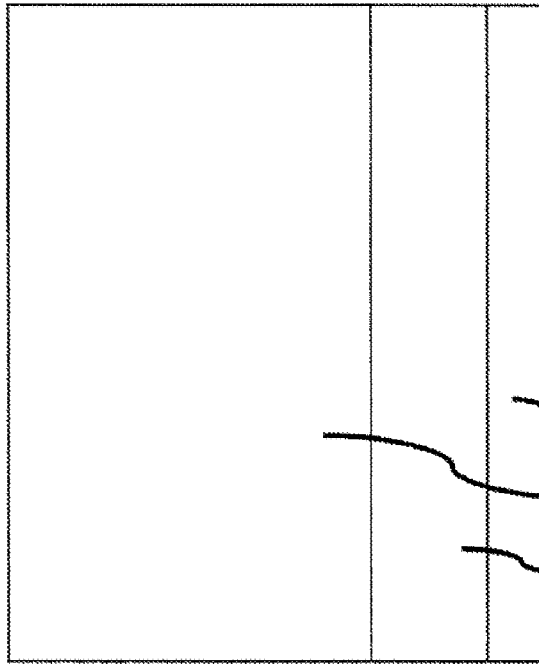
(b) DEVICE FORMING REGION
101 102 103

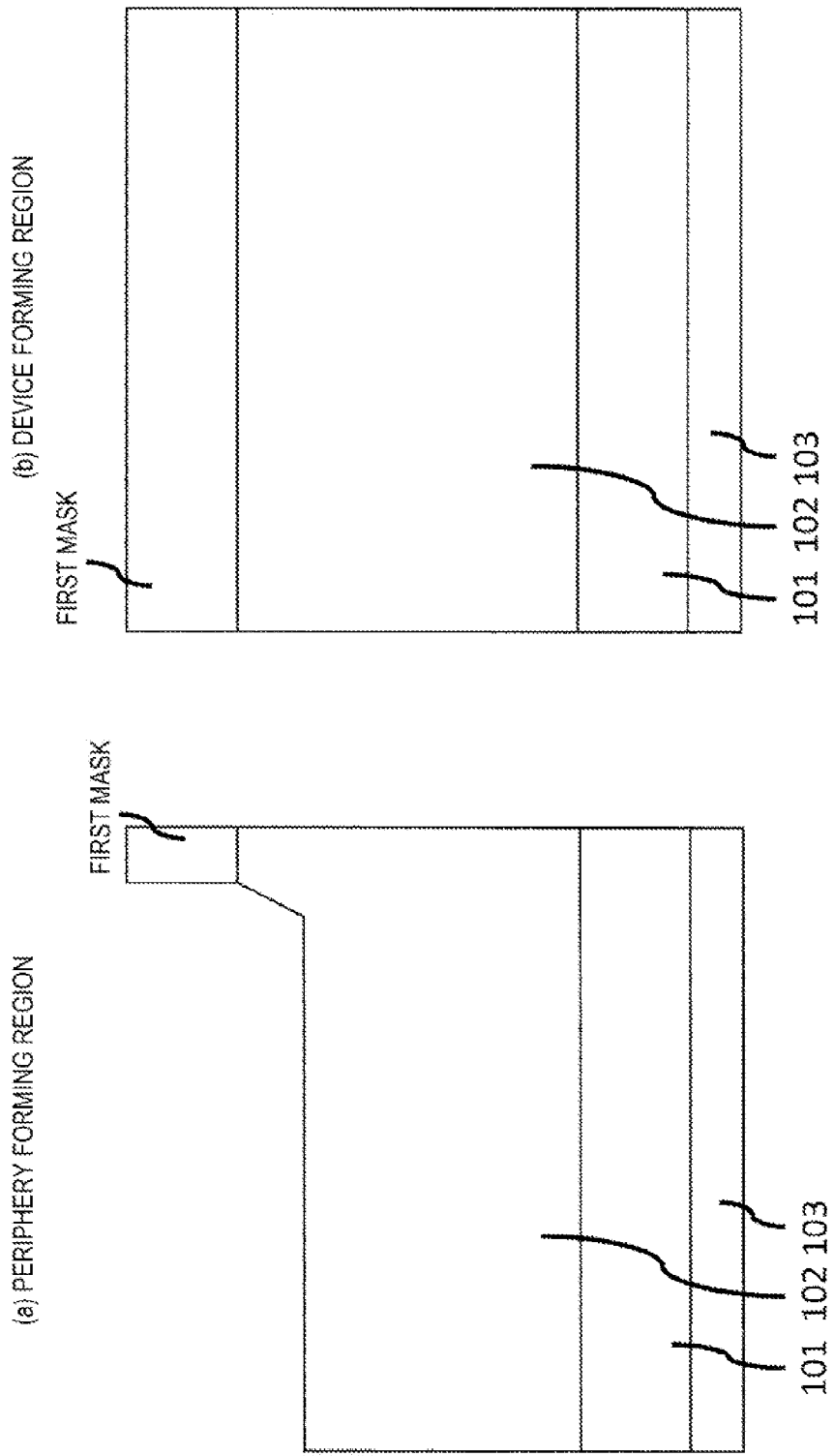

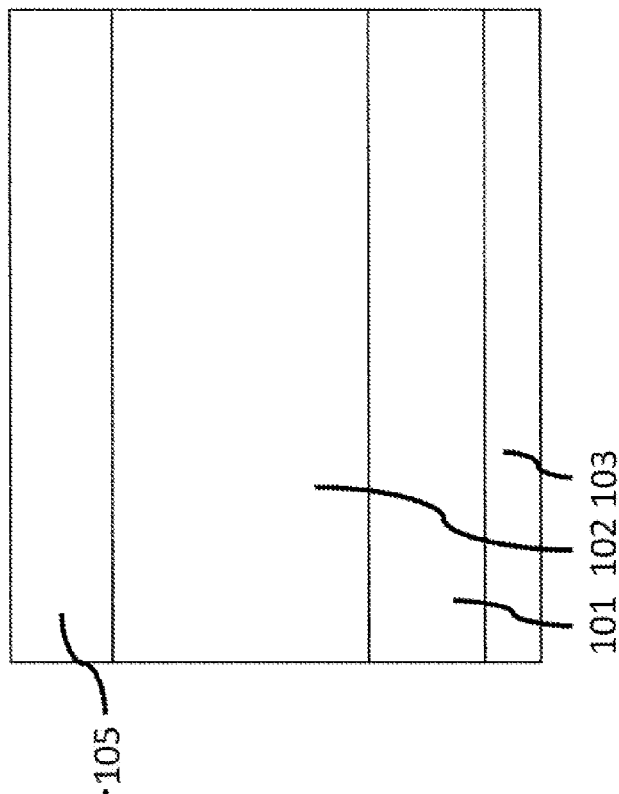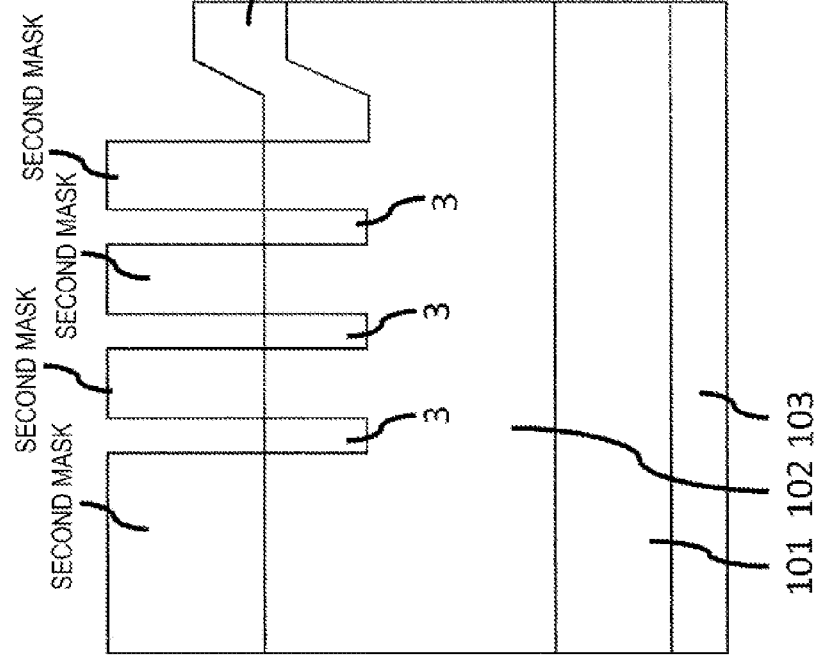

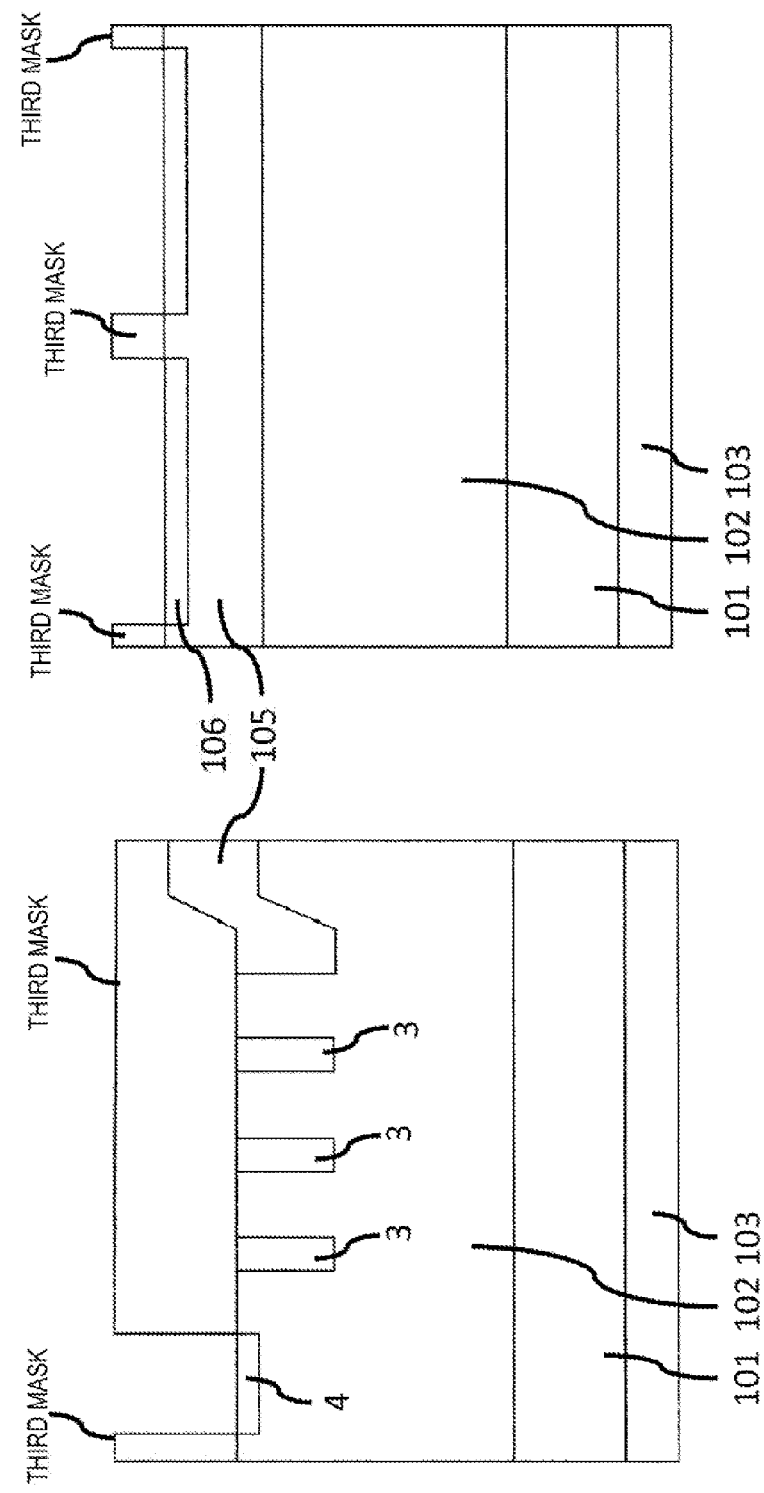
[FIG. 6]

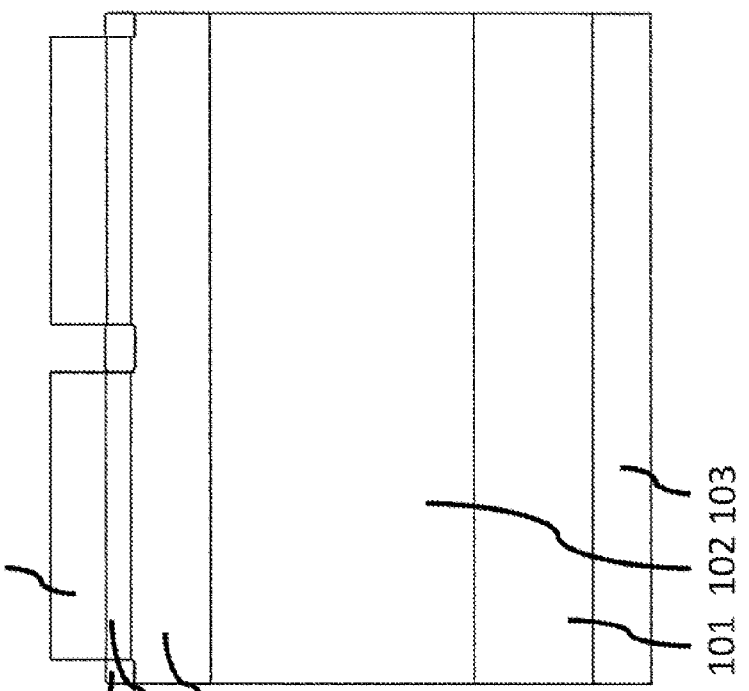
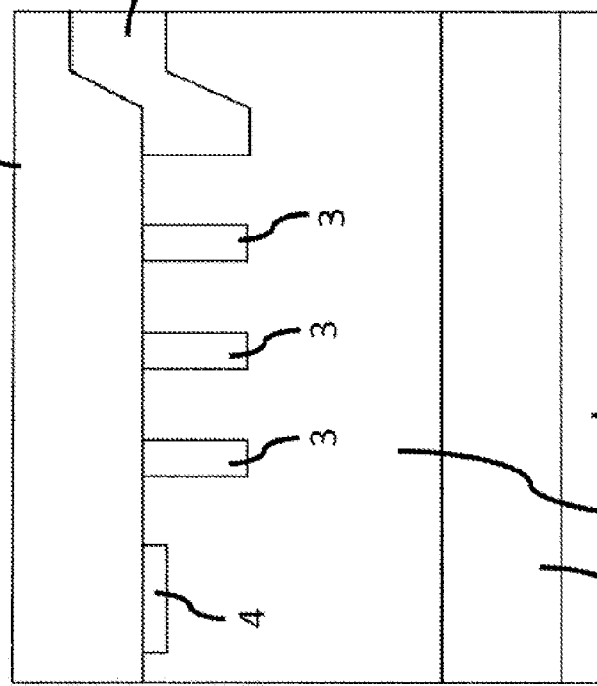

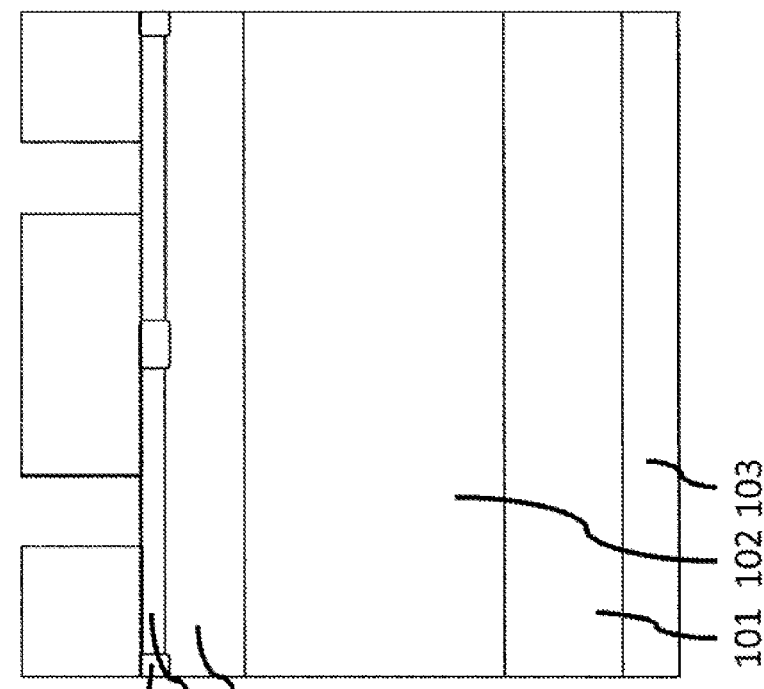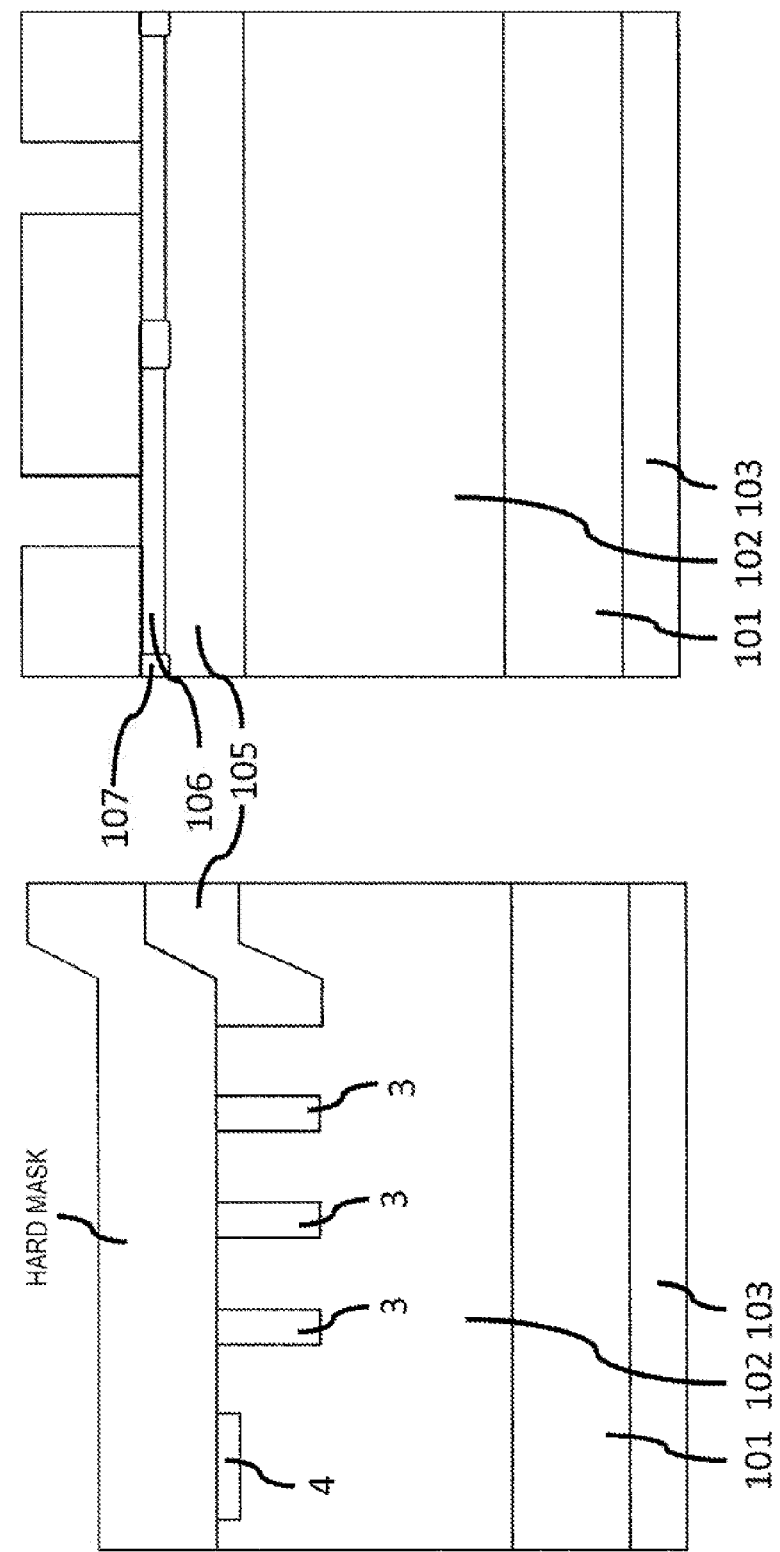

[FIG. 9]
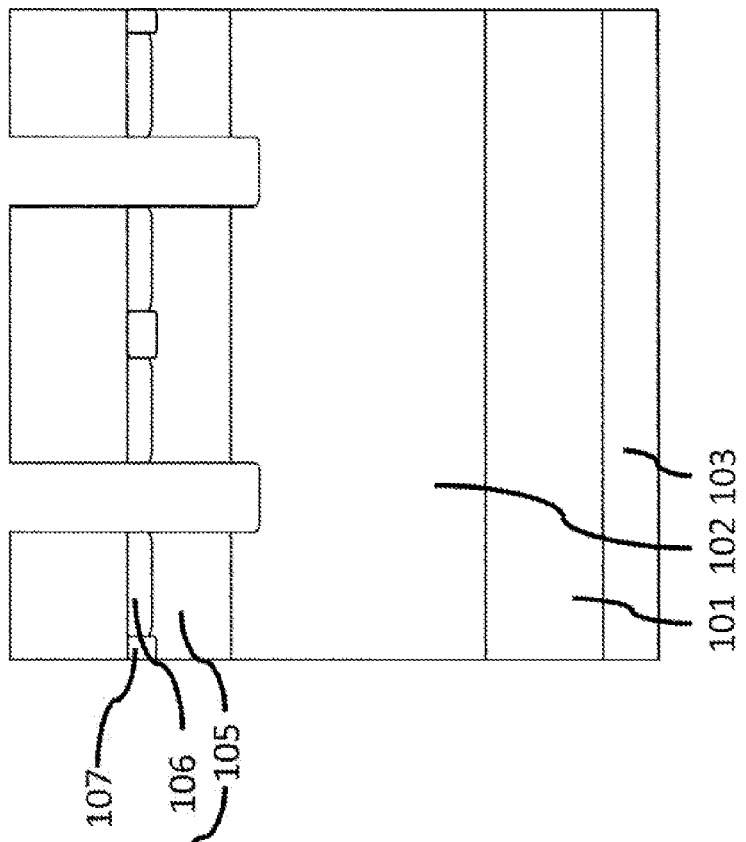
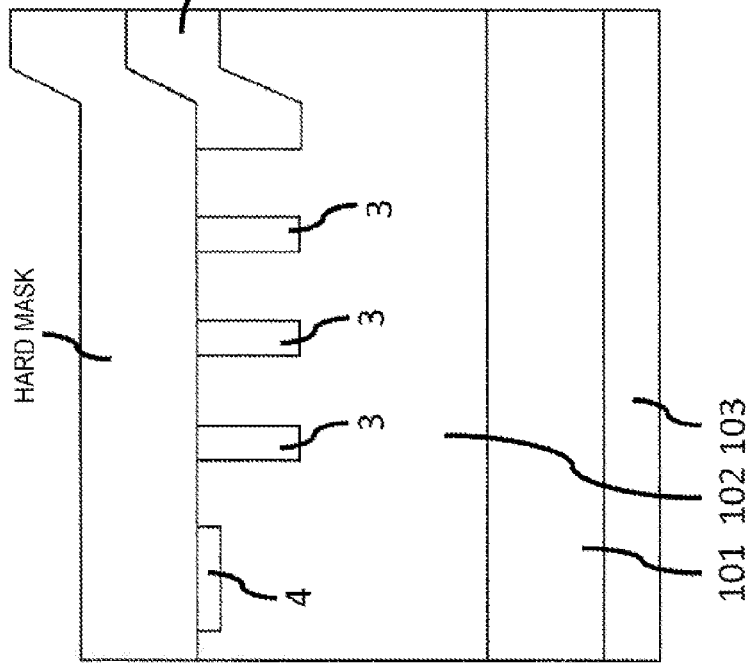

[FIG. 10]
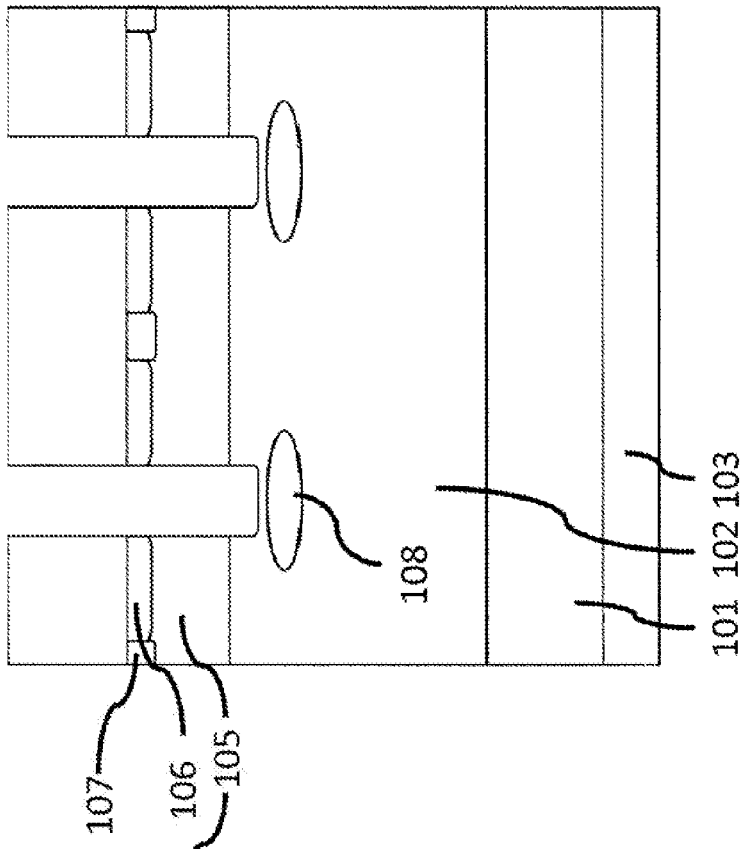
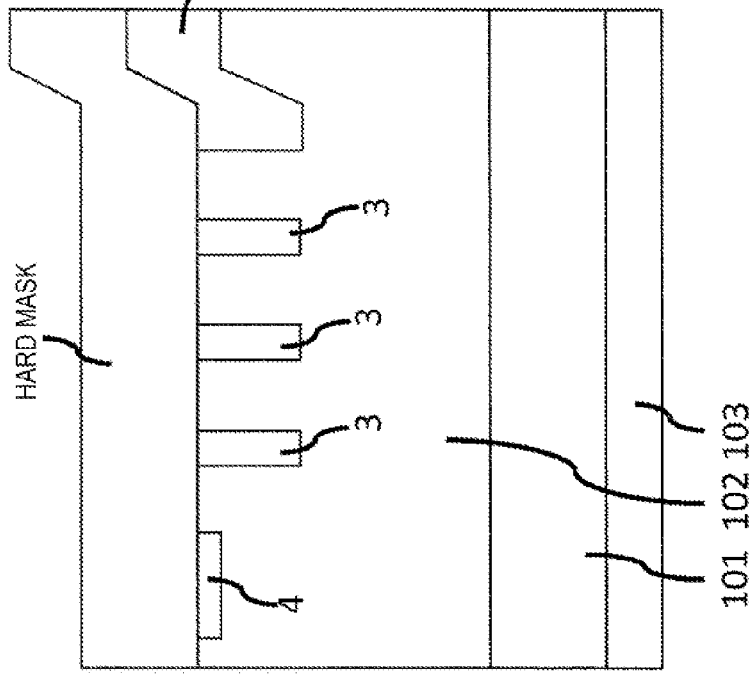

[FIG. 11]
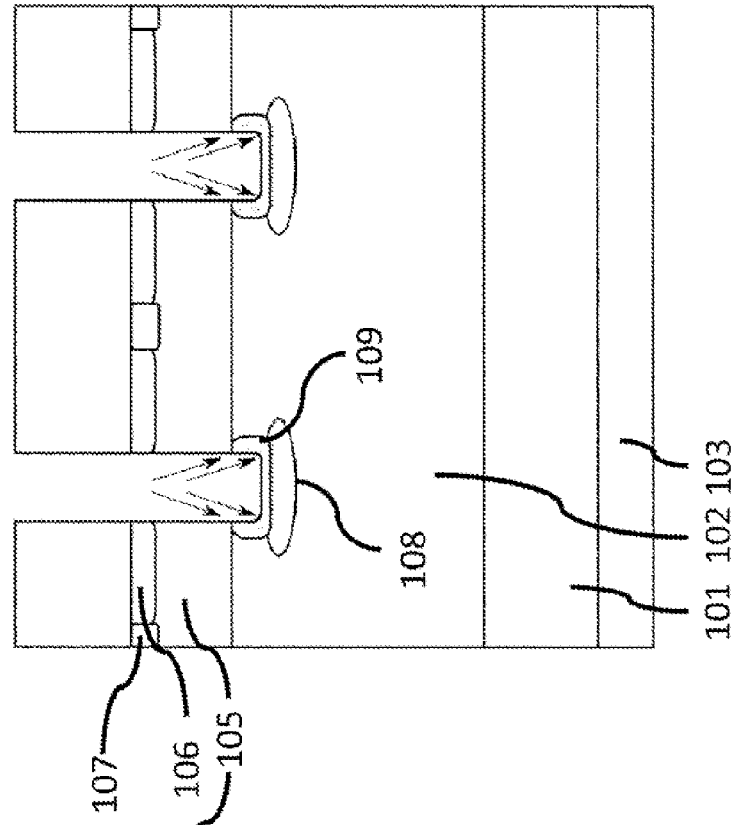
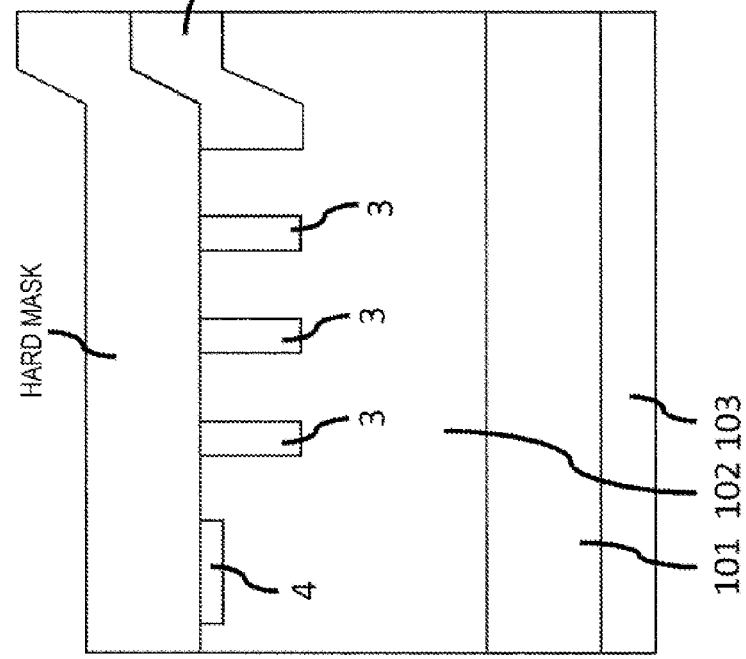

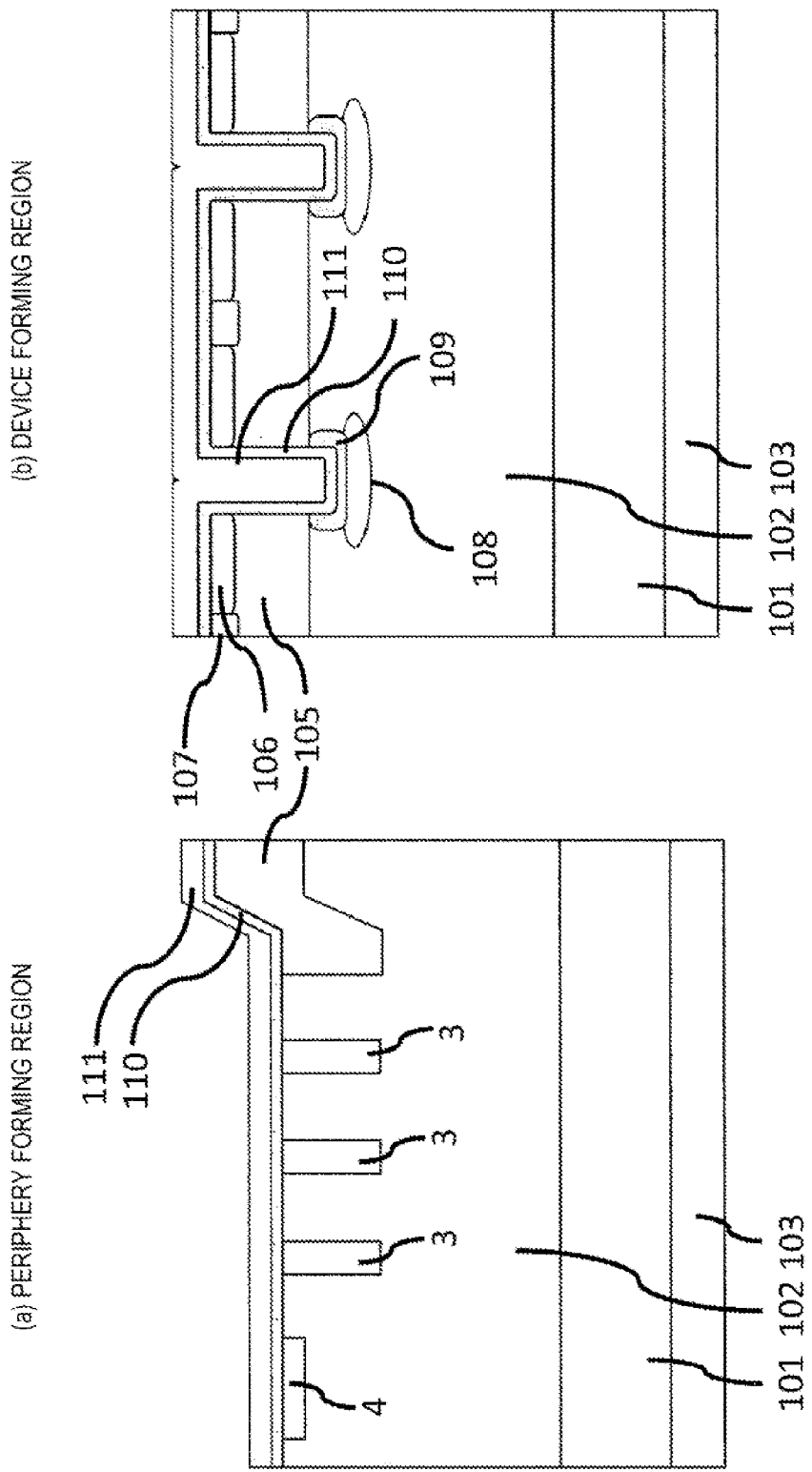

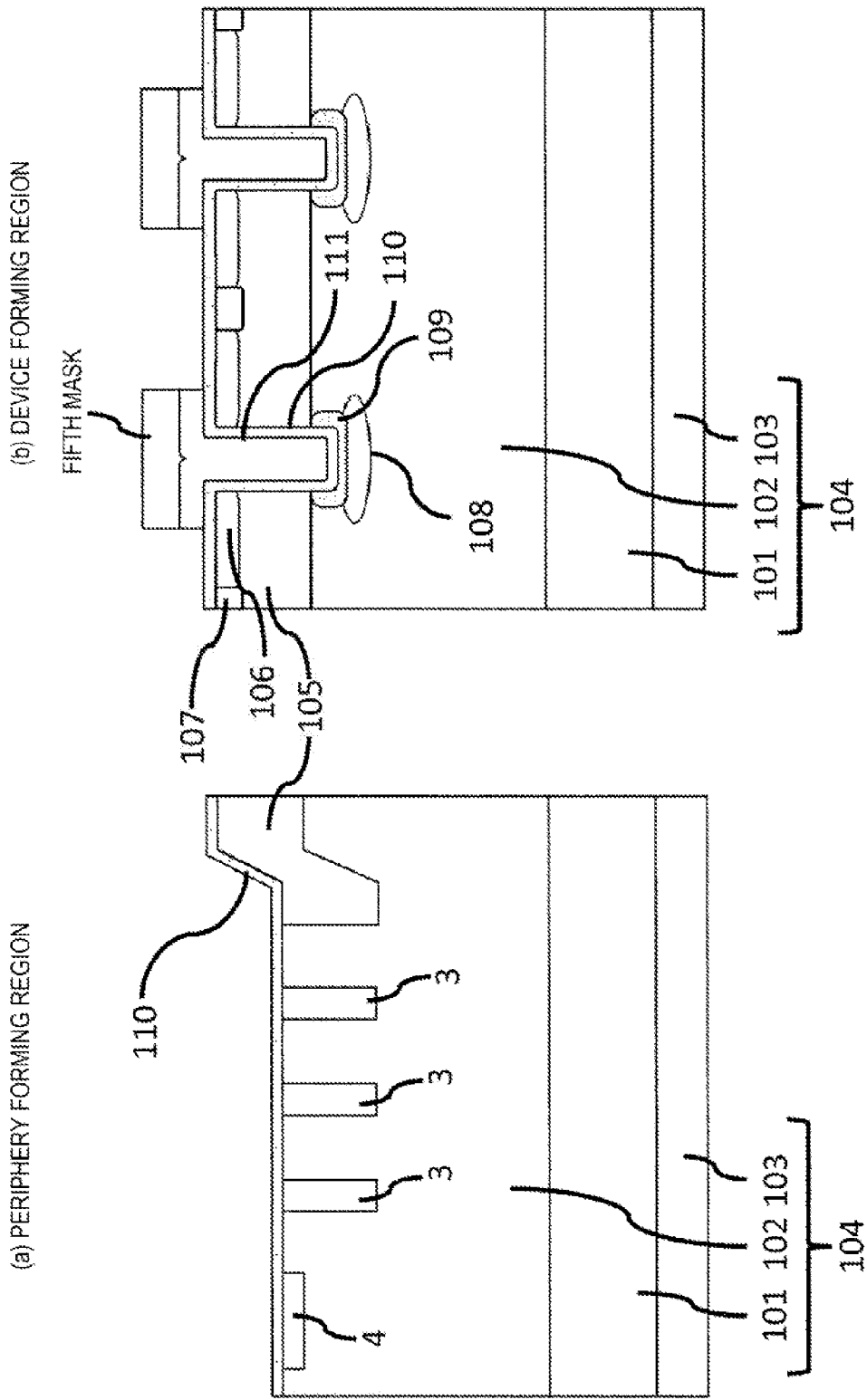

[FIG. 14]
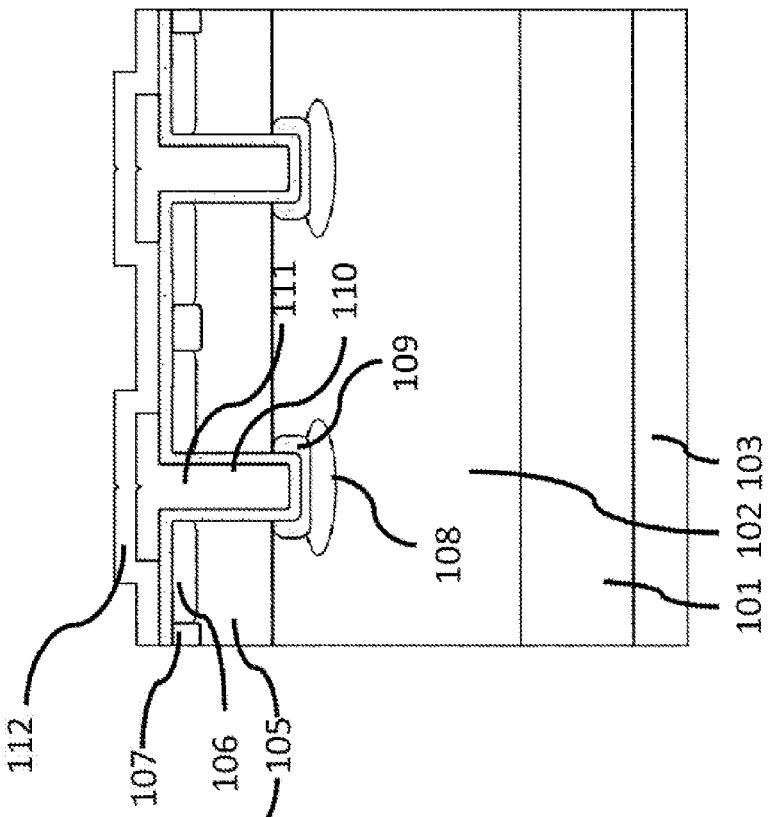
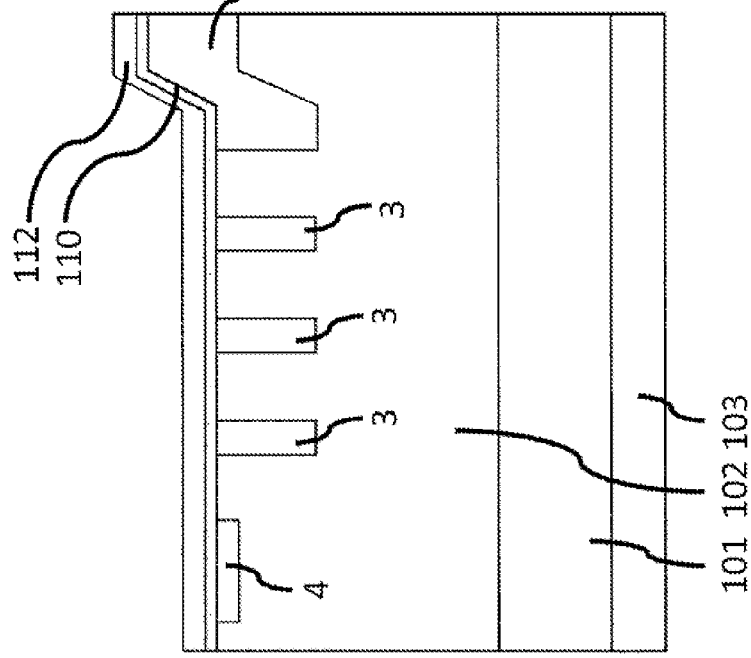

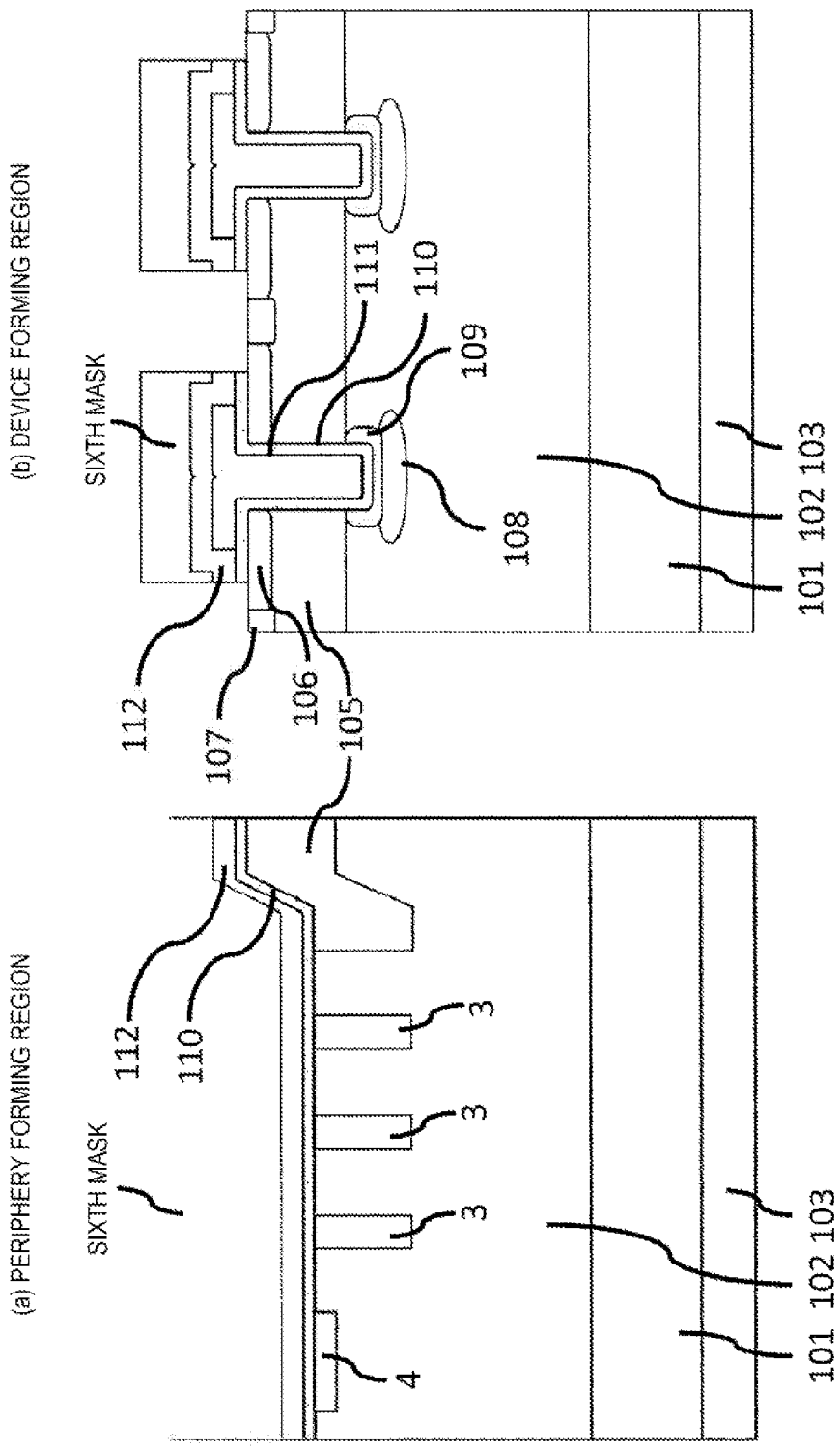
[FIG. 15]

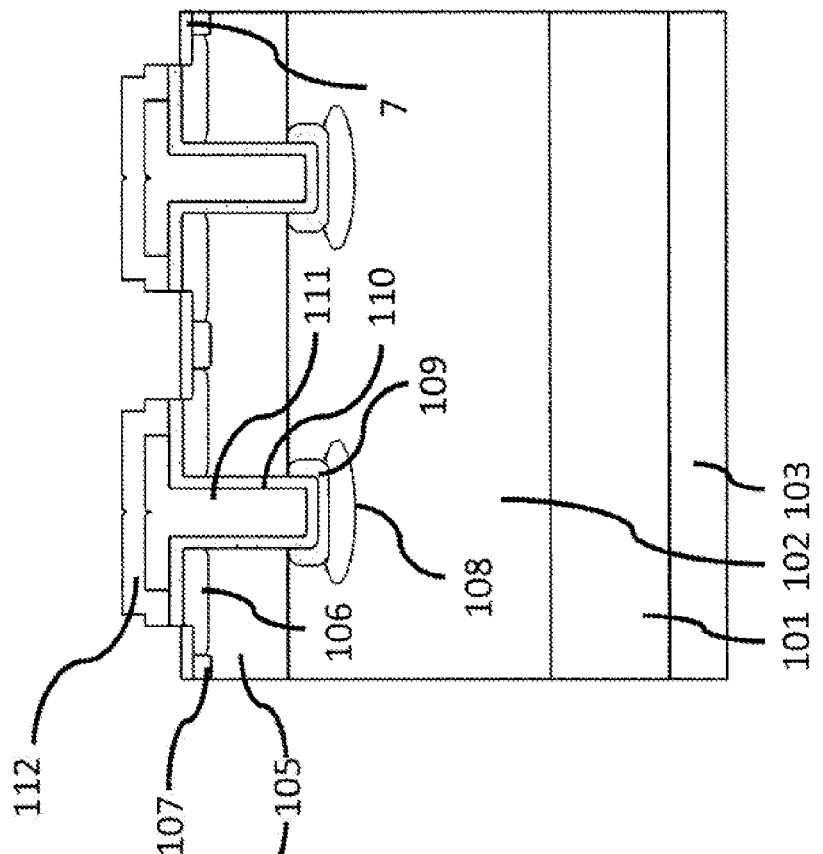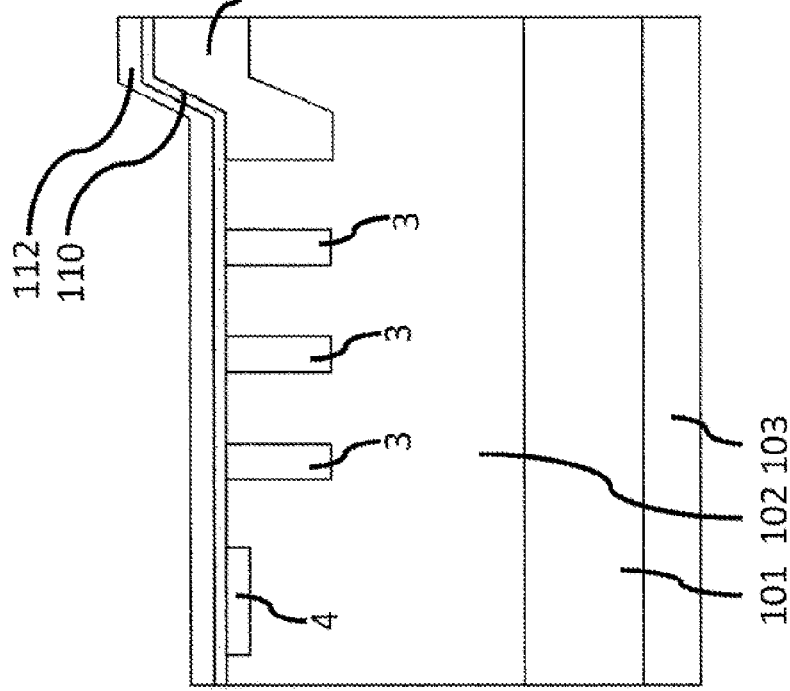
[FIG. 16]

[FIG. 17]
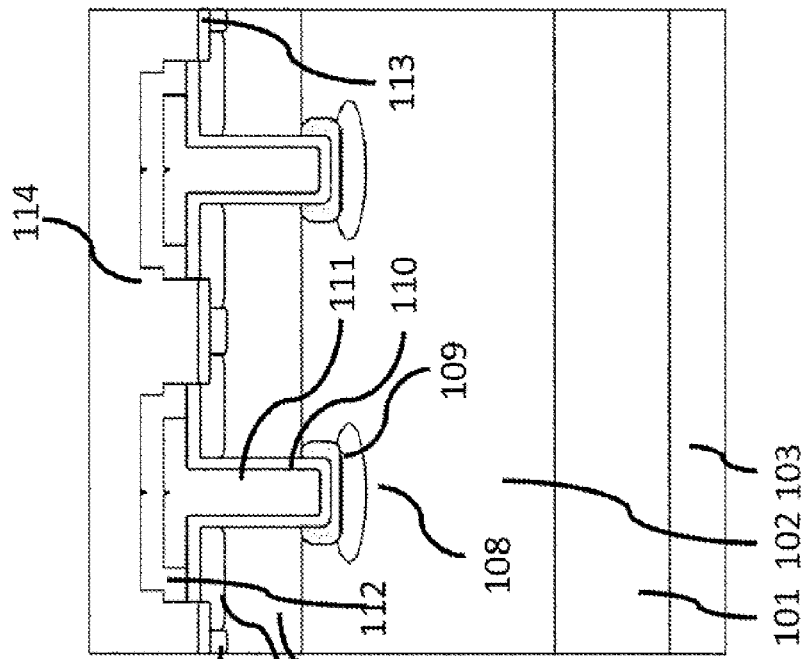
(b) DEVICE FORMING REGION
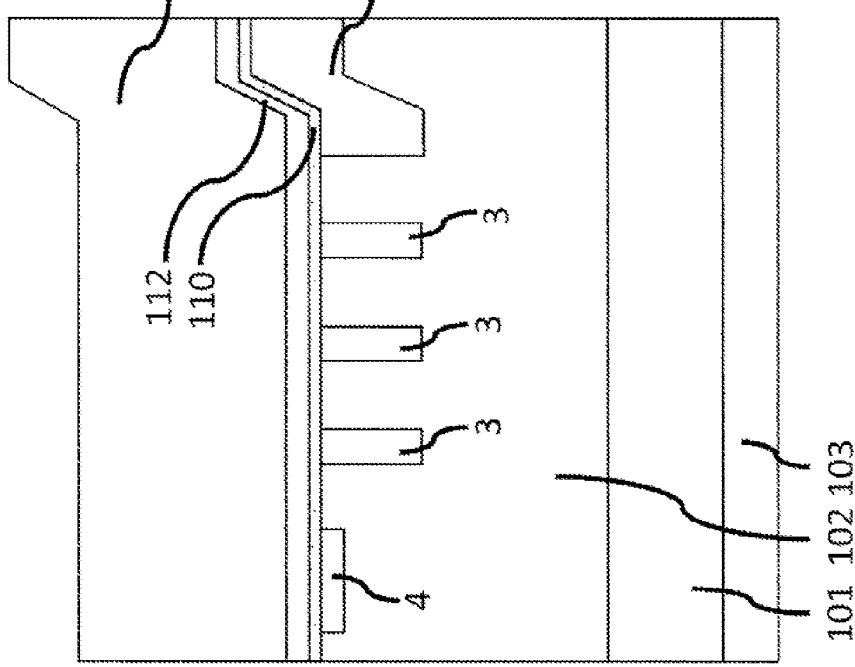
(a) PERIPHERY FORMING REGION

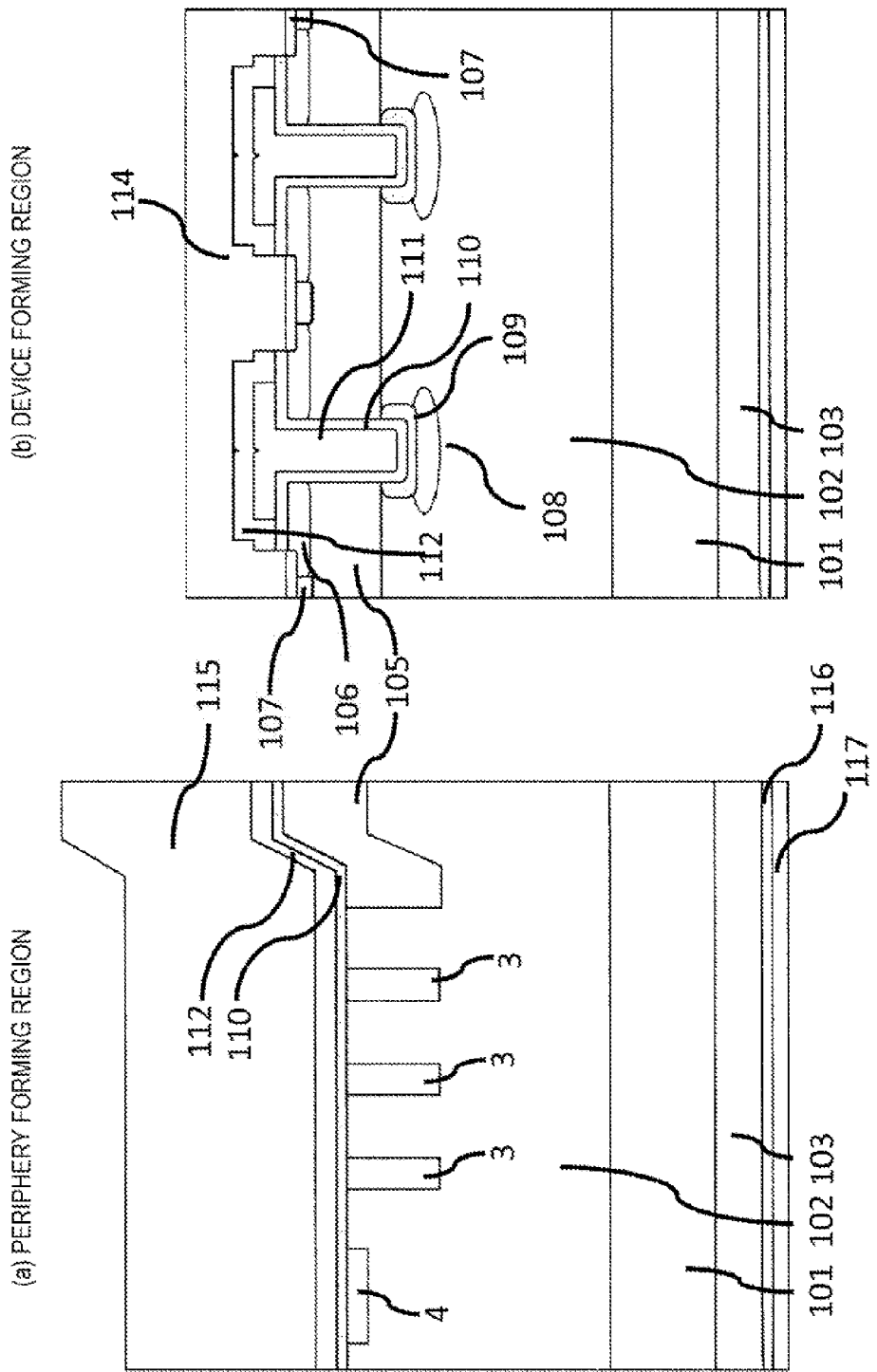

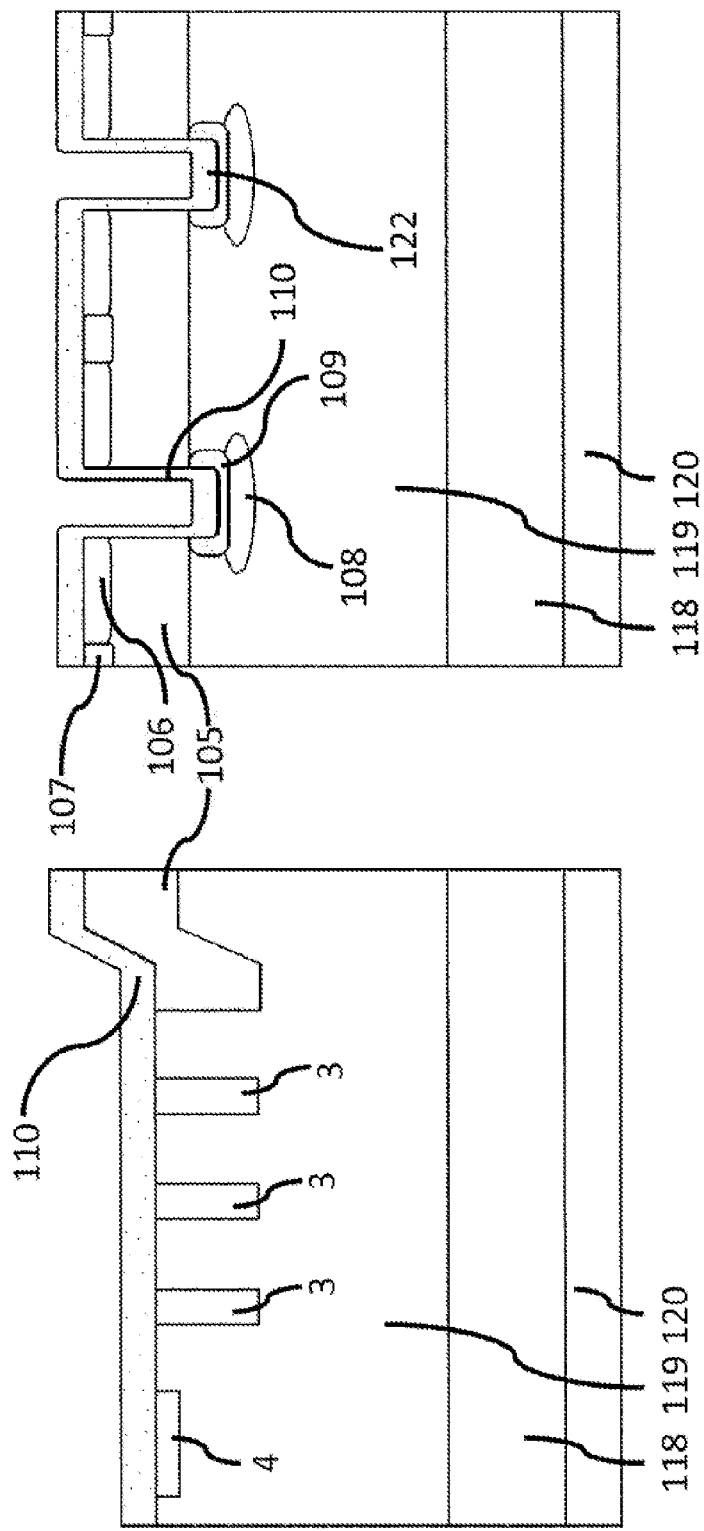

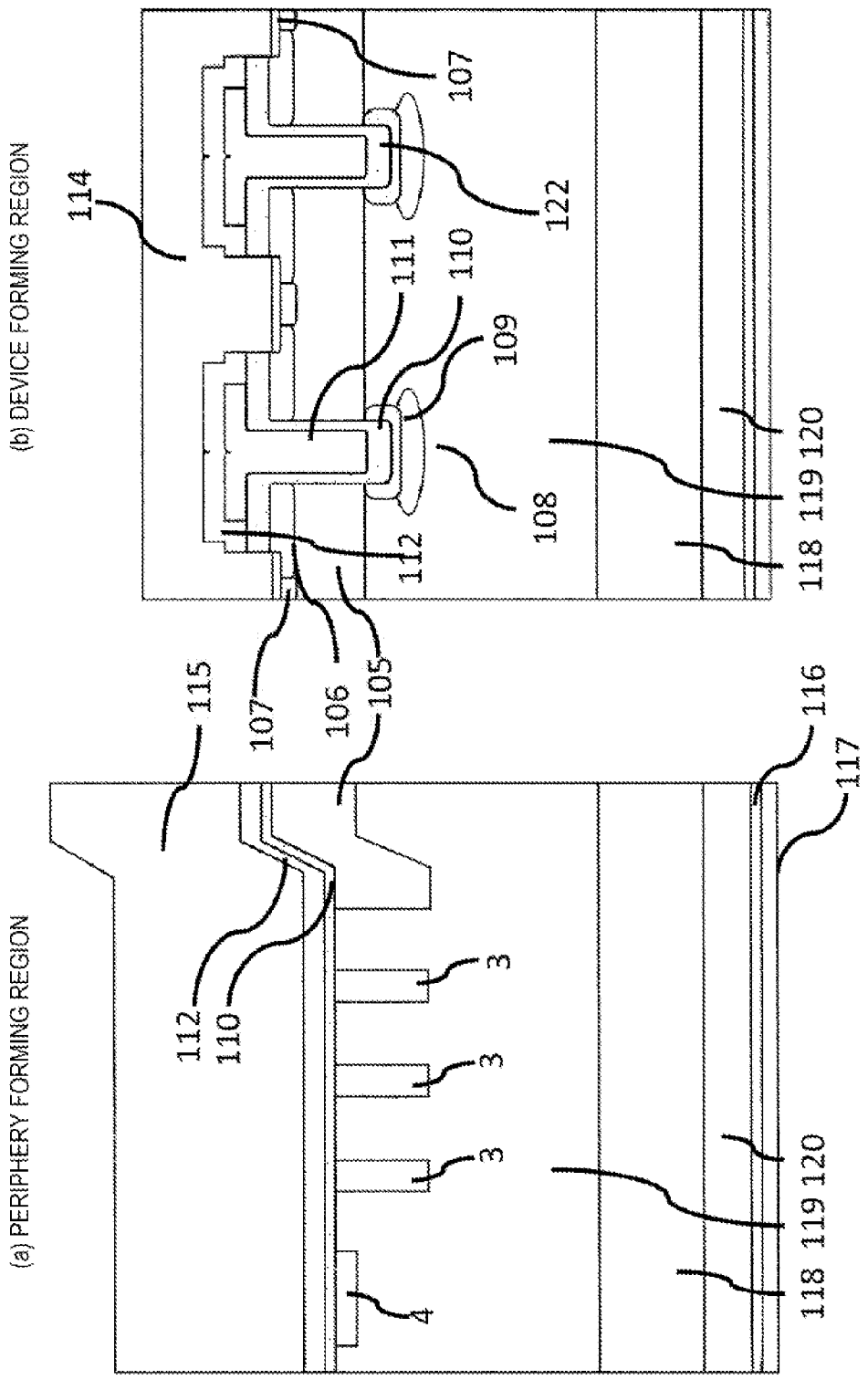
[FIG. 20]

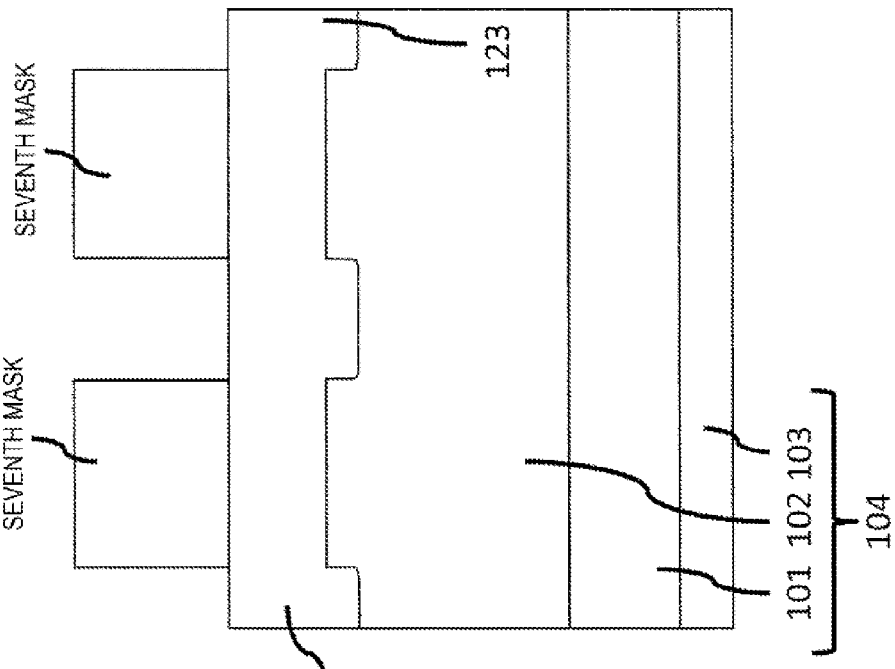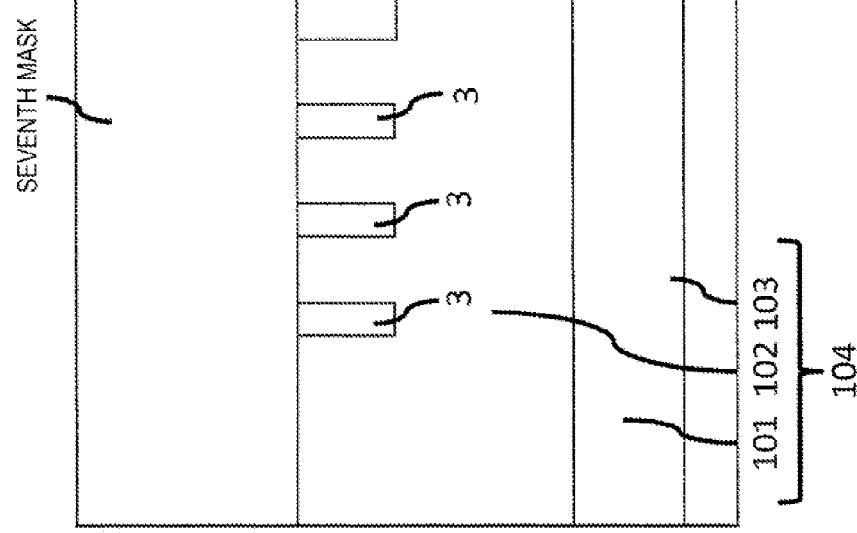

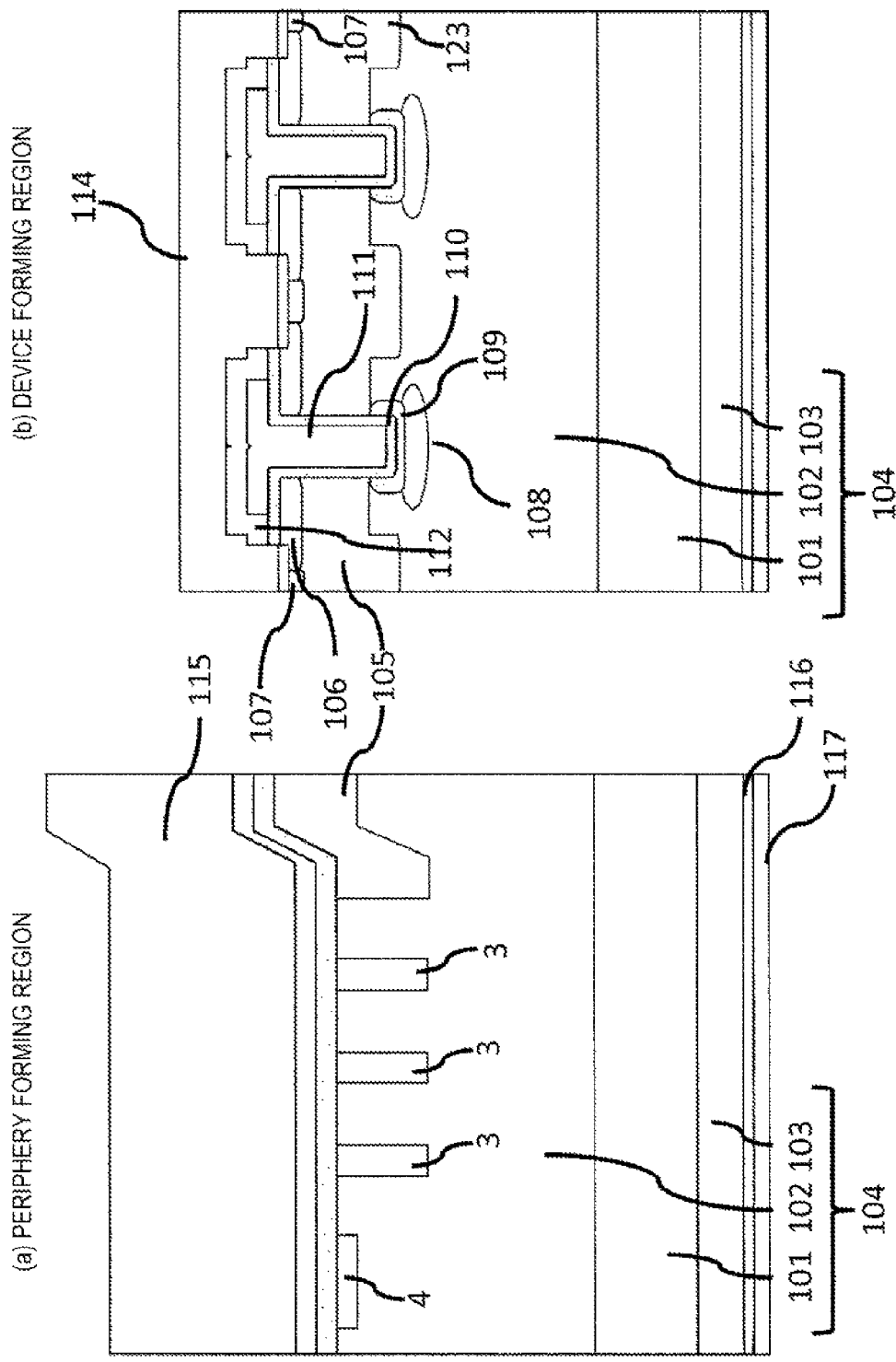

SILICON CARBIDE SEMICONDUCTOR DEVICE AND METHOD FOR PRODUCING SAME

TECHNICAL FIELD

The present invention relates to a silicon carbide semiconductor device, and a technique for producing same, particularly to a trenched metal insulator semiconductor field effect transistor (MISFET).

BACKGROUND ART

Trenched MISFETs using silicon carbide (SiC) involve high SiC breakdown field strength, which creates a high electric field in the gate insulating film at the bottom portion of the trench during the OFF time, and tends to destroy the gate insulating film.

Trenched MISFETs thus require lowering the electric field applied during the OFF time to the gate insulating film at the bottom portion of the trench. U.S. Pat. No. 6,180,958B1 (Patent Literature 1) addresses this issue by proposing a technique that relaxes the electric field with a p-type layer disposed immediately below the gate insulating film at the lower portion of the trench. With the p-type layer disposed immediately below the gate insulating film at the lower portion of the trench, the voltage resistance at the junction between the p-type layer and an n-type layer of a drift layer in the lower portion of the gate insulating film is maintained, and the gate insulating film remains reliable. Trenched MISFETs also involve high gate-drain capacitance (feedback capacitance) compared to DMIS (double diffused Metal Insulator Semiconductor) FETs. An increased feedback capacitance is not desirable as it lowers the switching rate, and causes a defect called breakthrough. Feedback capacitance can be reduced by forming a p-type layer at the lower portion of the trench as in Patent Literature 1.

Forming a p-type layer at the lower portion of the trench is thus effective at relaxing the applied electric field to the gate insulating film, and reducing the feedback capacitance.

However, a p-type layer disposed at the lower portion of the trench as in Patent Literature 1 inhibits the flow of carriers from the channel to the drain electrode during the ON time, and increases ON resistance. Japanese Patent No. 4577355 (Patent Literature 2) attempts to solve the tradeoff between the reliability of the gate insulating film and ON resistance with a structure that suppresses increase of ON resistance with an arch-shaped p-type layer that is closer at the central portion to the lower portion of the trench, and is farther away from the trench at the periphery portion.

JP-A-2009-260064 (Patent Literature 3) discloses disposing a p-type layer below the trench in a manner allowing the p-type layer to partially cross the lower portion of the trench. The applied OFF-time electric field to the gate insulating film is relaxed with the p-type layer that crosses portions of the trench lower portion.

CITATION LIST

Patent Literature

Patent Literature 1: U.S. Pat. No. 6,180,958B1
Patent Literature 2: Japanese Patent No. 4577355
Patent Literature 3: JP-A-2009-260064

SUMMARY OF INVENTION

Technical Problem

The methods proposed to overcome the characteristic tradeoff issue of trenched MISFETs involve various technical problems, as follows.

The structures described in Japanese Patent No. 4577355 (Patent Literature 2) and JP-A-2009-260064 (Patent Literature 3) intrinsically require the epitaxial technique, and involve high processing costs, and poor reliability due to epitaxial defects.

The positional relationship with the p-type layer also becomes important when disposing an n layer. The n layer, when existing alone in part or wider than the p-type layer, has the effect to cause a channel punch-through, and lower the voltage resistance.

It is an object of the invention to provide a trenched MISFET structure with which the applied OFF-time electric field to the gate insulating film can be relaxed to provide a sufficient voltage resistance while sufficiently lowering the ON resistance during the ON time.

Solution to Problem

The following is a representative example of the invention disclosed herein.

A silicon carbide semiconductor device includes:

a first-conductivity-type substrate of silicon carbide having a first principal surface and a second principal surface opposite the first principal surface;

a first-conductivity-type drift layer of silicon carbide disposed on the first principal surface;

a second-conductivity-type body layer formed on the drift layer, the second conductivity type being different from the first conductivity type;

a first-conductivity-type source region that is in contact with the body layer;

a trench formed into the drift layer through the body layer;

a gate insulating film disposed on an inner wall of the trench;

a gate electrode that is in contact with the body layer via the gate insulating film;

a first-conductivity-type drain region disposed on the second principal surface of the substrate;

a resistance relaxation layer that is in contact with the trench in the drift layer; and a field relaxation layer that is in contact with a part of a bottom portion of the resistance relaxation layer, and is wider than the resistance relaxation layer.

Advantageous Effects of Invention

The invention can provide a trenched MISFET structure with which the applied OFF-time electric field to the gate insulating film can be relaxed to provide a sufficient voltage resistance while sufficiently lowering the ON resistance during the ON time.

BRIEF DESCRIPTION OF DRAWINGS

FIG. 1 is a top view of a relevant portion of a silicon carbide semiconductor device configured from a plurality of SiC power MISFETs according to First Embodiment.

FIG. 2 is a cross sectional view of a relevant portion of the silicon carbide semiconductor device of First Embodiment.

FIG. 3 is a cross sectional view of a relevant portion of the silicon carbide semiconductor device, explaining a fabrication step of the silicon carbide semiconductor device of First Embodiment.

FIG. 4 is a cross sectional view of a relevant portion of the silicon carbide semiconductor device, representing a fabrication step following FIG. 3.

FIG. 5 is a cross sectional view of a relevant portion of the silicon carbide semiconductor device, representing a fabrication step following FIG. 4.

FIG. 6 is a cross sectional view of a relevant portion of the silicon carbide semiconductor device, representing a fabrication step following FIG. 5.

FIG. 7 is a cross sectional view of a relevant portion of the silicon carbide semiconductor device, representing a fabrication step following FIG. 6.

FIG. 8 is a cross sectional view of a relevant portion of the silicon carbide semiconductor device, representing a fabrication step following FIG. 7.

FIG. 9 is a cross sectional view of a relevant portion of the silicon carbide semiconductor device, representing a fabrication step following FIG. 8.

FIG. 10 is a cross sectional view of a relevant portion of the silicon carbide semiconductor device, representing a fabrication step following FIG. 9.

FIG. 11 is a cross sectional view of a relevant portion of the silicon carbide semiconductor device, representing a fabrication step following FIG. 10.

FIG. 12 is a cross sectional view of a relevant portion of the silicon carbide semiconductor device, representing a fabrication step following FIG. 11.

FIG. 13 is a cross sectional view of a relevant portion of the silicon carbide semiconductor device, representing a fabrication step following FIG. 12.

FIG. 14 is a cross sectional view of a relevant portion of the silicon carbide semiconductor device, representing a fabrication step following FIG. 13.

FIG. 15 is a cross sectional view of a relevant portion of the silicon carbide semiconductor device, representing a fabrication step following FIG. 14.

FIG. 16 is a cross sectional view of a relevant portion of the silicon carbide semiconductor device, representing a fabrication step following FIG. 15.

FIG. 17 is a cross sectional view of a relevant portion of the silicon carbide semiconductor device, representing a fabrication step following FIG. 16.

FIG. 18 is a cross sectional view explaining a relevant portion of a variation of the SiC power MISFETs of First Embodiment.

FIG. 19 is a cross sectional view of a relevant portion of a silicon carbide semiconductor device, explaining a fabrication step of the silicon carbide semiconductor device of Second Embodiment.

FIG. 20 is a cross sectional view of a relevant portion of the silicon carbide semiconductor device, representing a fabrication step following FIG. 19.

FIG. 21 is a cross sectional view of a relevant portion of a silicon carbide semiconductor device, explaining a fabrication step of the silicon carbide semiconductor device of Third Embodiment.

FIG. 22 is a cross sectional view of a relevant portion of the silicon carbide semiconductor device, representing a fabrication step following FIG. 21.

DESCRIPTION OF EMBODIMENTS

Embodiments are disclosed below.

First Embodiment

Silicon Carbide Semiconductor Device

The structure of the silicon carbide semiconductor device of First Embodiment is described below with reference to FIGS. 1 and 2. FIG. 1 is a top view of a relevant portion of a semiconductor chip with the silicon carbide semiconductor device configured from a plurality of SiC power MISFETs. FIG. 2 is a cross sectional view of a relevant portion of the SiC power MISFETs. The SiC power MISFETs forming the silicon carbide semiconductor device are MISFETs of a trenched structure.

As represented in FIGS. 1 and 2, a semiconductor chip 1 mounting the silicon carbide semiconductor device is configured from an active region (device forming region) 2 in which a plurality of n-channel-type SiC power MISFETs is connected in parallel, and a periphery forming region surrounding the active region 2 in planar view. The periphery forming region is formed by a plurality of p-type floating field limited rings (FLRs) 3 formed around the active region 2 in planar view, and an n-type channel stopper (depletion layer inhibiting layer) 4 formed around the plurality of p-type FLRs 3 in planar view.

Components such as the gate electrodes, the $n^+$-type source region, and the channel region of the SiC power MISFETs are formed on the front-surface side of the active region of an n-type silicon carbide (SiC) epitaxial substrate (hereinafter, "SiC epitaxial substrate"), and the $n^+$-type drain region of the SiC power MISFETs is formed on the back-surface side of the SiC epitaxial substrate.

With the plurality of p-type FLRs 3 formed around the active region 2, the maximum electric field portion sequentially transfers towards the outer FLRs 3 during the OFF time, and yields at the outermost FLR 3 to make the silicon carbide semiconductor device more voltage resistant. FIG. 1 shows three FLRs 3; however, this is merely an example, and the number of rings is not limited to three. The n-type channel stopper 4 serves to protect the SiC power MISFETs from leak current in the active region 2.

The gate electrodes of the SiC power MISFETs formed in the active region 2 are connected in a stripe pattern in planar view. The gate electrodes of all the SiC power MISFETs are electrically connected to a gate wire electrode 5 with extraction wires (gate bus line) that are individually connected to the stripe pattern. The gate electrodes, described as being formed in a stripe pattern, are not limited to this, and may be formed in a box pattern or a polygon pattern.

The source regions of the SiC power MISFETs are electrically connected to a source wire electrode 7 via apertures 6 formed through an interlayer insulating film 112 covering the SiC power MISFETs. The gate wire electrode 5 and the source wire electrode 7 are separated from each other, and the source wire electrode 7 is formed over substantially the whole surface of the active region 2 except for the region where the gate wire electrode 5 is formed. An $n^+$-type drain region 116 formed on the back-surface side of the n-type SiC epitaxial substrate is electrically connected to a drain wire electrode 117 formed over the whole back surface of the n-type SiC epitaxial substrate.

The following describes the structure with a primary focus on the cross sectional structure.

An $n^-$-type drift layer 102 of silicon carbide (SiC) having a lower impurity concentration than an n-type SiC substrate 101 is formed on the surface of the n-type SiC substrate (substrate) 101 of silicon carbide (SiC), and a p+-type drain layer 103 of silicon carbide (SiC) having a higher impurity concentration than the n-type SiC substrate 101 is formed on the back surface of the SiC substrate (substrate) 101. The n−-type drift layer 102 has a thickness of 5 to 50 μm.

A p-type body layer 105 is formed within the n−-type drift layer 102, predetermined distance deep from the surface of the n−-type drift layer 102. An n+-type source region 106 is formed within the p-type body layer 105, predetermined distance deep from the surface of the n−-type drift layer 102.

The p-type body layer 105 is 0.5 to 2.0 μm deep from the surface of the drift layer 102. The n+-type source region 106 is 0.1 to 0.4 μm deep from the surface of the drift layer 102.

A trench is formed through the n+-type source region 106 and the p-type body layer 105 from the surface of the n−-type drift layer 102. The trench is 0.55 to 3.0 μm deep, deeper than the p-type body layer 105.

An n-type resistance relaxation layer 109 is formed so as to cover the lower portion of the trench formed through the p-type body layer 105. The resistance relaxation layer 109 covering the trench is 0.05 to 0.5 μm deep from the trench.

Formed at the lower portion of the resistance relaxation layer 109 is a p-type field relaxation layer 108 that is wider than the resistance relaxation layer 109. The field relaxation layer 108 is 0.05 to 1 μm wider than the resistance relaxation layer 109. The field relaxation layer 108 is 0.2 to 0.5 μm deep from the resistance relaxation layer 109.

A p+-type potential fixing layer 107 that fixes the potential of the p-type body layer 105 is formed within the p-type body layer 105 over a predetermined depth from the surface of the n−-type drift layer 102. The p+-type potential fixing layer 107 is 0.05 to 0.2 μm deep from the surface of the drift layer 102. The notation "−" and "+" as used herein represent the relative impurity concentration for the n- and p-conductivity type. The impurity concentration for the n-type becomes higher from "n−", "n", and "n+", in this order.

The preferred impurity concentration range is $1 \times 10^{18}$ to $1 \times 10^{21}$ cm$^{-3}$ for the n+-type SiC substrate 101, $1 \times 10^{14}$ to $1 \times 10^{17}$ cm$^{-3}$ for the n−-type drift layer 102, and $1 \times 10^{16}$ to $1 \times 10^{19}$ cm$^{-3}$ for the p-type body layer 105. The preferred impurity concentration range for the n+-type source region 106 is $1 \times 10^{17}$ to $1 \times 10^{21}$ cm$^{-3}$. The preferred impurity concentration range for the n-type resistance relaxation layer 109 is $1 \times 10^{15}$ to $1 \times 10^{18}$ cm$^{-3}$, and the preferred impurity concentration range for the p-type field relaxation layer 108 is $1 \times 10^{16}$ to $1 \times 10^{19}$ cm$^{-3}$. The preferred impurity concentration range for the p+-type potential fixing layer 107 is $1 \times 10^{19}$ to $1 \times 10^{21}$ cm$^{-3}$. A gate insulating film 110 is formed on the side and bottom surfaces of the trench. A gate electrode 111 is formed on the gate insulating film 116, filling the trench. The interlayer insulating film 112 is formed so as to cover the gate electrode 111. A part of the n+-type source region 106, and the p+-type potential fixing layer 107 are exposed at the bottom surface of the aperture formed in the interlayer insulating film 112, and a metal silicide layer 113 is formed on the exposed surfaces. A part of the n+-type source region 106, and the p+-type potential fixing layer 107 are electrically connected to the source wire electrode 114 via the metal silicide layer 113, and the n+-type drain region 103 is electrically connected to the drain wire electrode 117 via the metal silicide layer 116. Though not illustrated, the gate electrode 111 is electrically connected to the gate wire electrode. A source potential, a drain potential, and a gate potential are externally applied to the source wire electrode 114, the drain wire electrode 117, and the gate wire electrode, respectively.

The following describes the characteristics of the configuration of the SiC power MISFETs according to First Embodiment.

The n-type resistance relaxation layer 109 is formed so as to partially cover the trench formed through the p-type body layer 105 and the n+-type source region 106 of the trenched MISFET, and the field relaxation layer 108 is formed that is wider than the p-type resistance relaxation layer. With the field relaxation layer 108, the applied OFF-time electric field to the gate insulating film 110 can be relaxed, and the gate insulating film can remain reliable. A channel punch-through becomes more likely with the insertion of the resistance relaxation layer 109. However, the occurrence of a channel punch-through is suppressed by the formation of the field relaxation layer 108 that is wider than the resistance relaxation layer 109. The field relaxation layer 108 directly below the trench has the possibility of generating a parasitic resistance and increasing the ON resistance. However, the occurrence of such a parasitic resistance due to the field relaxation layer 108 is inhibited with the resistance relaxation layer 109 formed between the field relaxation layer 108 and the trench bottom portion so as to cover the bottom portion and a part of the side wall of the trench, as shown in FIG. 2. By thus optimizing the field relaxation layer 108 and the resistance relaxation layer 109, it is possible to satisfy low ON resistance, high voltage resistance, and high reliability at the same time.

The field relaxation layer 108 can also reduce the feedback capacitance, and can achieve a high switching rate and high reliability for the trenched MISFETs.

Silicon Carbide Semiconductor Device Producing Method

A method for producing the silicon carbide semiconductor device of First Embodiment is described below in steps with reference to FIGS. 3 to 18. FIGS. 3 to 18 are cross sectional views magnifying relevant portions of the active region (device forming region) and the periphery forming region of the SiC power MISFETs of the silicon carbide semiconductor device.

First, an n-type 4H-SiC substrate 101 is prepared, as shown in FIG. 3. The n-type SiC substrate 101 has n-type impurities introduced therein. The n-type impurities are nitrogen (N). The n-type SiC substrate 101 has a Si surface and a C surface. In First Embodiment, the surface of the n-type SiC substrate 101 represents a Si surface.

The n−-type drift layer 102 of silicon carbide (SiC) is then formed on the surface of the n-type SiC substrate 101 by epitaxial growth. To the n−-type drift layer 102 are introduced n-type impurities of lower impurity concentration than the n-type SiC substrate 101. A SiC epitaxial substrate 104 with the n-type SiC substrate 101 and the n−-type drift layer 102 is formed after these steps.

Thereafter, the n+-type drain region 103 is formed on the back surface of the n-type SiC substrate 101 over a predetermined depth from the back surface of the n-type SiC substrate 101.

A first mask (recess processing mask for the periphery region) is then formed on the surface of the n−-type drift layer 102, as shown in FIG. 4. The first mask is formed in a thickness of 1.0 to 5.0 μm.

With the first mask in place, the periphery portion is dry etched to partially recess the n−-type drift layer 102. The recess depth depends on the depth of the field relaxation layer 108 formed in the device forming portion, and the recess is formed so that the p-type body layer 105 in the recess portion becomes deeper than the depth at the bottom portion of the field relaxation layer 108. The recess is 0.6 to 5.0 μm deep.

Thereafter, the first mask removed, and a second mask (mask for forming the body layer 105 and the FLRs 3) is formed, as shown in FIG. 5. The second mask is formed in a thickness of 1.0 to 2.0 µm. This is followed by ion implantation of p-type impurities and aluminum atoms (Al) into the n⁻-type drift layer 102 over the second mask. This forms the p-type body layer 105 in the device forming region of the n⁻-type drift layer 102, and the p-type FLRs (hereinafter, "rings") 3 in the periphery forming region. The p-type body layer 105 and the p-type FLRs 3 are 0.5 to 2.0 µm deep from the surface of the drift layer 102. The impurity concentrations of the p-type body layer 105 and the p-type rings 105 range from, for example, $1 \times 10^{16}$ to $1 \times 10^{19}$ cm⁻³. The present embodiment forms the FLRs 3 in the periphery forming region. However, the structure of the periphery forming region is not limited to this, and may be a junction termination extension (JTE) structure.

Thereafter, the second mask is removed, and a third mask (mask for forming the source region 106 and the channel stopper 4) is formed, as shown in FIG. 6. The third mask is formed in a thickness of 0.5 to 2.0 µm. This is followed by ion implantation of n-type impurities, and nitrogen atoms (N) or phosphorus atoms (P) into the n⁻-type drift layer 102 over the third mask to form the n⁺-type source region 106 in the device forming region, and the n⁺-type channel stopper 4 in the periphery forming region. The n⁺-type source region 106 and the n⁺-type channel stopper 4 are 0.1 to 0.4 µm deep from the surface of the drift layer 102.

The third mask is then removed, and a fourth mask is formed, as shown in FIG. 7. The fourth mask (mask for forming the potential fixing layer 107) is formed in a thickness of 0.5 to 2.0 µm.

This is followed by ion implantation of p-type impurities and aluminum atoms (Al) into the n⁻-type drift layer 102 over the fourth mask to form the p⁺-type potential fixing layer 107.

Thereafter, the fourth mask is removed, and a hard mask (trench processing mask) is formed, as shown in FIG. 8. First, a silicon oxide film is deposited in 1 to 4.0 µm by using plasma (vapor-phase growth method) CVD. The silicon oxide film is then dry etched to form the hard mask, using the resist pattern as a mask. The hard mask exposes only the portion where the desired trench needs to be formed. The aperture width is 0.5 to 2 µm.

The trench is formed through the n⁺-type source region 106 and the p-type body layer 105 by dry etching using the hard mask, as shown in FIG. 9. The trench is 0.55 to 3.0 µm deep.

With the hard mask in place, p-type impurities and Al or boron (B) are ion implanted into the trench lower portion to form the p-type field relaxation layer 108, as shown in FIG. 10. The field relaxation layer 108 can be formed at a position farther away from the center of the trench lower portion by implanting these elements at high energy (100 kev to 1000 keV). The high-energy ion implantation also widens the impurity distribution, and as a result the field relaxation layer 108 becomes wider than the resistance relaxation layer 109 formed after the field relaxation layer 108. The field relaxation layer 108 becomes 0.05 to 1 µm wider than the resistance relaxation layer 109.

Thereafter, with the hard mask in place, n-type impurities, N (nitrogen), and P (phosphorus) are obliquely ion implanted into the trench lower portion to form the n-type resistance relaxation layer 109 that covers the trench lower portion, as shown in FIG. 11. The resistance relaxation layer 109 covering the trench lower portion can be formed by performing the oblique ion implantation 4 times with a twist angle of 45, 135, 225, and 315 degrees at a 0 to 20 degree tilt angle. The ion implantation energy ranges from 5 keV to 300 keV. The low-energy implantation allows the resistance relaxation layer 109 to be formed between the trench lower portion and the field relaxation layer 108. The resistance relaxation layer 109 can also become narrower than the field relaxation layer 108. The impurity concentration of the resistance relaxation layer 109 is lower than that of the field relaxation layer 108, and is ⅕ of the impurity concentration of the field relaxation layer 108 in the present embodiment.

After removing the hard mask with hydrofluoric acid, a carbon (C) film is deposited on the front and back surfaces of the SiC epitaxial substrate 104 by using a plasma CVD method (not illustrated). The carbon (C) film has a thickness of 0.03 µm. With the front and back surfaces of the SiC epitaxial substrate 104 covered with the carbon (C) film, the SiC epitaxial substrate 104 is subjected to a heat treatment for 2 to 3 minutes at a temperature of 1500° C. or more. This activates the impurities ion-implanted into the SiC epitaxial substrate 104. After the heat treatment, the carbon (C) film is removed by an oxygen plasma treatment.

Thereafter, as shown in FIG. 12, the gate insulating film 110 is formed on the surface of the n⁻-type drift layer 102. The gate insulating film 110 is a silicon oxide ($SiO_2$) film formed by a thermal CVD method. The gate insulating film 110 has a thickness of 0.05 to 0.15 µm. The electric field applied to the gate insulating film 110 during the OFF time can be relaxed when the gate insulating film 110 is a high-dielectric film having a higher relative permittivity than silicon oxide. The high-dielectric film may be a high-dielectric film of one or more selected from the group consisting of silicon nitride, silicon oxynitride, hafnium oxide, aluminum oxide, and zirconium oxide.

Thereafter, an n-type polycrystalline silicon (Si) film 111 is deposited on the gate insulating film so as to fill the trench. The thickness of the n-type polycrystalline silicon film 111 is 0.25 to 1.5 µm, though it depends on the aperture width of the trench.

The polycrystalline silicon film 111 is then dry etched to form the gate electrode 111, using a fifth mask (gate electrode processing mask), as shown in FIG. 13.

Thereafter, as shown in FIG. 14, the fifth mask is removed, and the interlayer insulating film 112 is formed on the surface of the n⁻-type drift layer 102 so as to cover the gate electrode 111 and the gate insulating film 110, by using a plasma CVD method.

With a sixth mask (contact processing mask), the interlayer insulating film 112 and the gate insulating film 110 are dry etched to form an aperture that reaches a part of the n⁺-type source region 106, and the p⁺-type potential fixing layer 107, as shown in FIG. 15.

Thereafter, as shown in FIG. 16, the sixth mask is removed, and the metal silicide layer 113 is formed on a part of the n⁺-type source region 106, and on the p⁺-type potential fixing layer 107 in the exposed surfaces at the bottom surface of the aperture.

Though not illustrated, a first metallization film, and nickel (Ni) are first deposited by sputtering on the surface of the n⁻-type drift layer 102 so as to cover the interlayer insulating film 112 and inside of the aperture (the side surface and the bottom surface). The first metallization film is formed in a thickness of 0.05 µm. This is followed by a silicidation heat treatment at 500 to 900° C. to cause a reaction between the first metallization film and the n⁻-type drift layer 102 at the bottom surface of the aperture, and form the metal silicide layer 113 and a nickel silicide (NiSi) layer on a part of the n⁺-type source region 106, and on the p+-type potential fixing layer 107 in the exposed surfaces at the bottom surface of the aperture. The unreacted first metallization film is removed by wet etching, for which a mixture of sulfuric acid and peroxide is used.

The interlayer insulating film 112 is then dry etched over the mask to form an aperture that reaches the gate electrode 111 (not illustrated).

Thereafter, as shown in FIG. 17, a laminate of a third metallization film, a titanium (Ti) film, a titanium nitride (TiN) film, and an aluminum (Al) film is deposited on the aperture that reaches the metal silicide film 113 formed on the surfaces of a part of the n+-type source region 106 and the p+-type potential fixing layer 107. The laminate is also deposited on the interlayer insulating film 112 including inside of the aperture (not illustrated) that reaches the gate electrode 111. The aluminum (Al) film has a thickness of preferably 2.0 μm or more. The third metallization film is then processed to form the source wire electrode 114 that is electrically connected to a part of the n+-type source region 107 and to the p+-type potential fixing layer 107 via the metal silicide layer 113, and the gate wire electrode (not illustrated) that is electrically connected to the gate electrode 111.

A passivation film 115 is then formed to protect the device, as shown in FIG. 17. The passivation film 115 has a thickness of 2 to 10 μm, and is made of material such as silicon oxide and polyimide.

Thereafter, a second metallization film is deposited by sputtering on the back surface of the n+-type SiC substrate 101, though not illustrated. The second metallization film has a thickness of 0.1 μm.

This is followed by a laser annealing silicidation process, which, as shown in FIG. 18, causes a reaction between the second metallization film and the n+-type SiC substrate 101, and forms the metal silicide layer 116 so as to cover the n+-type drain region 103 formed on the back-surface side of the n+-type SiC substrate 101. The drain wire electrode 117 is then formed over the metal silicide layer 116. The drain wire electrode 117 has a thickness of 0.4 μm.

As described above, in First Embodiment, the n-type resistance relaxation layer 109 is formed so as to cover a part of the trench formed through the p-type body layer 105 and the n+-type source region 106 of the trenched MISFET, and the field relaxation layer 108 is formed that is wider than the p-type resistance relaxation layer. This makes it possible to relax the applied OFF-time electric field to the gate insulating film 110, and suppress the occurrence of a channel punch-through and a parasitic resistance while maintaining the reliability of the gate insulating film. The formation of the field relaxation layer 108 can also reduce the feedback capacitance, and enables the switching rate to be increased, and improving the reliability of circuit operation by preventing defects such as a breakthrough.

By thus optimizing the field relaxation layer 108 and the resistance relaxation layer 109, it is possible to realize the SiC power trenched MISFET satisfying the high-voltage resistance, high reliability, and high performance at the same time.

Second Embodiment

Second Embodiment differs from First Embodiment in that a SiC epitaxial substrate 121 having a C surface is used to selectively increase the thickness of the gate insulating film 120 in the trench lower portion.

Silicon Carbide Semiconductor Device Producing Method

A method for producing the silicon carbide semiconductor device of Second Embodiment is described below in steps with reference to FIGS. 19 and 20. FIGS. 19 and 20 are cross sectional views of relevant portions of the silicon carbide semiconductor device, explaining the steps of producing the silicon carbide semiconductor device of Second Embodiment.

An n−-type drift layer 119 is formed on the surface of an n-type SiC substrate 118. The impurity concentration is $1\times10^{18}$ to $1\times10^{21}$ cm$^{-3}$ for the n+-type SiC substrate 119, and $1\times10^{14}$ to $1\times10^{17}$ cm$^{-3}$ for the n−-type drift layer 119. An n+-type drain region 120 is then formed on the back-surface side of the n+-type SiC substrate 118. The impurity concentration for the n+-type drain region 120 is $1\times10^{19}$ to $1\times10^{21}$ cm$^{-3}$. The difference from First Embodiment is that the polarity of the front and back surfaces is reversed in the epitaxial substrate 104 and the epitaxial substrate 121. Specifically, the front and back surfaces of the epitaxial substrate 121 represent a C surface and a Si surface, respectively, in Second Embodiment.

The periphery portion is dry etched to form a partial recess (not illustrated). The recess depth depends on the depth of the field relaxation layer 108 formed in the device forming portion, and the recess is formed so that the p-type body layer 105 in the recess portion becomes deeper than the depth at the bottom portion of the field relaxation layer 108. The recess is 0.6 to 5.0 μm deep.

The p-type body layer 105 is then formed in the device forming region of the n−-type drift layer 119, and p-type rings 105 (not illustrated) are formed in the periphery forming region. The p-type body layer 105 and the p-type rings 105 are 0.5 to 2.0 μm deep from the surface of the drift layer 119. The impurity concentrations of the p-type body layer 105 and the p-type rings 105 range from, for example, $1\times10^{16}$ to $1\times10^{19}$ cm$^{-3}$. Here, the p-type rings 105 are formed in the periphery forming region. However, the structure of the terminal portion is not limited to this, and may be a junction termination extension (JTE) structure.

This is followed by ion implantation of n-type impurities, and nitrogen atoms (N) or phosphorus atoms (P) into the n−-type drift layer 119 to form the n+-type source region 106 in the device forming region, and the n+-type channel stopper 4 in the periphery forming region (not illustrated). The n+-type source region 106 and the n+-type channel stopper 4 are 0.1 to 0.4 μm deep from the surface of the drift layer 102.

This is followed by ion implantation of p-type impurities and aluminum atoms (Al) into the n−-type drift layer 119 to form the p+-type potential fixing layer 107. Thereafter, a hard mask (not illustrated) is formed. First, a silicon oxide film is deposited in 1 to 4.0 μm by using plasma (vapor-phase growth method) CVD. The silicon oxide film is then dry etched to form the hard mask, using the resist pattern as a mask. The hard mask exposes only the portion where the desired trench needs to be formed. The aperture width is 0.5 to 2 μm.

The trench is formed through the n+-type source region 106 and the p-type body layer 105 by dry etching using the hard mask (not illustrated).

With the hard mask in place, p-type impurities and Al or B are ion implanted into the trench lower portion to form the p-type field relaxation layer 108 (not illustrated). The impurity ion implantation energy for the field relaxation layer 108 ranges from 100 keV to 1000 keV. The field relaxation layer 108 can be formed at a position farther away from the center of the trench lower portion by implanting these elements at such high energy. The distance is 0.05 to 0.5 μm. The high-energy ion implantation also widens the impurity distribution, and as a result the field relaxation layer 108 becomes wider than the resistance relaxation layer 109 formed after the field relaxation layer 108. The field relaxation layer 108 becomes 0.05 to 1 μm wider than the resistance relaxation layer 109.

Thereafter, with the hard mask in place, n-type impurities, N (nitrogen), and P (phosphorus) are obliquely ion implanted into the trench lower portion to form the n-type resistance relaxation layer 109 that covers the trench lower portion (not illustrated). The impurity concentration of the n-type resistance relaxation layer 109 is $1\times10^{15}$ to $1\times10^{18}$ $cm^{-3}$. The resistance relaxation layer 109 covering the trench lower portion can be formed by performing the oblique ion implantation 4 times with a twist angle of 45, 135, 225, and 315 degrees at a 0 to 20 degree tilt angle. The ion implantation energy ranges from 5 key to 300 keV. The low-energy implantation allows the resistance relaxation layer 109 to be formed between the trench lower portion and the field relaxation layer 108. The resistance relaxation layer 109 can also become narrower than the field relaxation layer 108. The impurity concentration of the resistance relaxation layer 109 is lower than that of the field relaxation layer 108, and is ⅕ of the impurity concentration of the field relaxation layer 108.

After removing the hard mask with hydrofluoric acid, a carbon (C) film is deposited on the front and back surfaces of the SiC epitaxial substrate 121 by using a plasma CVD method (not illustrated). The carbon (C) film has a thickness of 0.03 μm. With the front and back surfaces of the SiC epitaxial substrate 104 covered with the carbon (C) film, the SiC epitaxial substrate 121 is subjected to a heat treatment for 2 to 3 minutes at a temperature of 1500° C. or more. This activates the impurities ion-implanted into the SiC epitaxial substrate 104. After the heat treatment, the carbon (C) film is removed by an oxygen plasma treatment.

Thereafter, as shown in FIG. 19, a gate insulating film 110, and a gate insulating film 122 (at the trench bottom portion) are formed on the surface of the n⁻-type drift layer 119. The trench bottom portion has a C surface, and the thermal oxidation of the C surface proceeds faster than in other plane orientations. Specifically, the gate insulating film 122 at the trench bottom portion can be made thicker than the gate insulating film 111 formed at the trench side surface. When the gate insulating film 110 and a part of the gate insulating film 122 are formed by dry oxidation, the gate insulating film 122 can be 2 to 10 times thicker than the gate insulating film 110. The thicknesses of the gate insulating film 110 and the gate insulating film 122 can be adjusted by using a thermal CVD method after forming the gate insulating film 110 and a part of the gate insulating film 122 by thermal oxidation. The gate insulating film 110 has a thickness of 0.05 to 0.15 μm. The gate insulating film 122 has a thickness of 0.1 to 0.5 μm.

Thereafter, an n-type polycrystalline silicon (Si) film 111 is deposited on the gate insulating film so as to fill the trench (not illustrated). The thickness of the n-type polycrystalline silicon film 111 is 0.25 to 1.5 μm, though it depends on the aperture width of the trench. The polycrystalline silicon film 111 is dry etched to form the gate electrode 111. After removing the fifth mask, an interlayer insulating film 112 (not illustrated) is formed on the surface of the n⁻-type drift layer 102 so as to cover the gate electrode 111 and the gate insulating film 110, by using a plasma CVD method.

The interlayer insulating film 112 and the gate insulating film 110 are dry etched to form an aperture that reaches a part of the n⁺-type source region 106, and the p⁺-type potential fixing layer 107 (not illustrated).

Thereafter, the metal silicide layer 113 is formed on a part of the n⁺-type source region 106, and on the p⁺-type potential fixing layer 107 in the exposed surfaces at the bottom surface of the aperture (not illustrated).

The interlayer insulating film 112 is then dry etched to form an aperture that reaches the gate electrode 111 (not illustrated).

Thereafter, a laminate of a third metallization film, a titanium (Ti) film, a titanium nitride (TiN) film, and an aluminum (Al) film is deposited on the aperture that reaches the metal silicide film 113 formed on the surfaces of a part of the n⁺-type source region 106 and the p⁺-type potential fixing layer 107. The laminate is also deposited on the interlayer insulating film 112 including inside of the aperture (not illustrated) that reaches the gate electrode 111. The aluminum (Al) film has a thickness of preferably 2.0 μm or more. The third metallization film is then processed to form the source wire electrode 114 that is electrically connected to a part of the n⁺-type source region 107 and to the p⁺-type potential fixing layer 107 via the metal silicide layer 113, and the gate wire electrode (not illustrated) that is electrically connected to the gate electrode 111.

A passivation film 115 is then formed to protect the device. The passivation film 115 has a thickness of 2 to 10 μm, and is made of material such as silicon oxide and polyimide.

Thereafter, a second metallization film is deposited by sputtering on the back surface of the n⁺-type SiC substrate 118, though not illustrated. The second metallization film has a thickness of 0.1 μm.

This is followed by a laser annealing silicidation process, which, as shown in FIG. 20, causes a reaction between the second metallization film and the n⁺-type SiC substrate 118, and forms the metal silicide layer 116 so as to cover the n⁺-type drain region 120 formed on the back-surface side of the n⁺-type SiC substrate 118. The drain wire electrode 117 is then formed over the metal silicide layer 116. The drain wire electrode 117 has a thickness of 0.4 μm.

As described above, in Second Embodiment, the gate insulating film 122 at the trench bottom portion of the trenched MISFET can be made thicker than the gate insulating film 110 formed at the trench side wall, as shown in FIG. 20. This makes it possible to further relax the applied OFF-time electric field to the gate insulating film 122, and realize the SiC power trenched MISFET having improved gate insulating film reliability.

Third Embodiment

Third Embodiment differs from First and Second Embodiments in that a body layer 123 is formed that is deeper than and continuous to the body layer 105.

Silicon Carbide Semiconductor Device Producing Method

A method for producing the silicon carbide semiconductor device of Third Embodiment is described below in steps with reference to FIGS. 21 and 22. FIGS. 21 and 22 are cross sectional views magnifying relevant portions of the SiC power MISFET forming region (device forming region) and the periphery forming region of the silicon carbide semiconductor device.

An n⁻-type drift layer 102 is formed on the surface of the n⁺-type SiC substrate (substrate) 101, and a SiC epitaxial substrate 104 is formed that includes the n⁺-type SiC substrate 101 and an n⁻-type drift layer 102. The impurity concentration is $1\times10^{18}$ to $1\times10^{21}$ $cm^{-3}$ for the n⁺-type SiC substrate 101, and $1\times10^{14}$ to $1\times10^{17}$ cm$^{-3}$ for the n$^-$-type drift layer 102. An n$^+$-type drain region 103 is then formed on the back-surface side of the n$^+$-type SiC substrate 101. The impurity concentration for the n$^+$-type drain region 103 is $1\times10^{19}$ to $1\times10^{21}$ cm$^{-3}$. The surface may have either polarity, Si or C, and is assumed to be a Si surface in the present embodiment.

The periphery portion is dry etched to form a recess (not illustrated). The recess depth depends on the depth of the field relaxation layer 108 formed in the device forming portion, and the recess is formed so that the p-type body layer 105 in the recess portion becomes deeper than the depth at the bottom portion of the field relaxation layer 108. The recess is 0.6 to 5.0 μm deep.

The p-type body layer 105 is then formed in the device forming region of the n$^-$-type drift layer 102, and p-type rings 105 (not illustrated) are formed in the periphery forming region. The p-type body layer 105 and the p-type rings 105 are 0.5 to 2.0 μm deep from the surface of the drift layer 102. The impurity concentrations of the p-type body layer 105 and the p-type rings 105 range from, for example, $1\times10^{16}$ to $1\times10^{19}$ cm$^{-3}$. Here, the p-type rings 105 are formed in the periphery forming region. However, the structure of the terminal portion is not limited to this, and may be a p-type junction termination extension (JTE) structure.

Thereafter, a seventh mask (high energy implantation mask) is formed, and a p-type body layer 123 is formed, as shown in FIG. 21. The p-type body layer 123 has a depth of 0.55 to 3.0 μm, though it depends on the location of the trench bottom portion. The impurity concentration ranges from $1\times10^{18}$ to $1\times10^{19}$ cm$^{-3}$. Various methods are available for the formation of the p-type body layer 123, including a method in which impurities are implanted after forming a trench. Third Embodiment uses a high-energy implantation method. The energy is between 400 keV to 1500 keV. The distance between the p-type body layer 123 and the trench side surface is 0.1 to 0.5 μm.

This is followed by ion implantation of n-type impurities, and nitrogen atoms (N) or phosphorus atoms (P) into the n$^-$-type drift layer 102 to form the n$^+$-type source region 106 in the device forming region, and the n$^+$-type channel stopper 106 in the periphery forming region (not illustrated). The n$^+$-type source region 106 and the n$^+$-type channel stopper 106 are 0.1 to 0.4 μm deep from the surface of the drift layer 102.

This is followed by ion implantation of p-type impurities and aluminum atoms (Al) into the n$^-$-type drift layer 102 to form the p$^+$-type potential fixing layer 107 (not illustrated). The p$^+$-type potential fixing layer 107 is 0.1 to 0.4 μm deep from the surface of the drift layer 102. The impurity concentration of the p$^+$-type potential fixing layer 107 is $1\times10^{19}$ to $1\times10^{21}$ cm$^{-3}$.

Thereafter, a hard mask (not illustrated) is formed. First, a silicon oxide film is deposited in 1 to 4.0 μm by using plasma (vapor-phase growth method) CVD. The silicon oxide film is then dry etched to form the hard mask, using the resist pattern as a mask. The hard mask exposes only the portion where the desired trench needs to be formed. The aperture width is 0.5 to 2 μm.

The trench is formed through the n$^+$-type source region 106 and the p-type body layer 105 by dry etching using the hard mask (not illustrated). The trench depth is 0.55 to 3.0 μm.

With the hard mask in place, p-type impurities and Al or B are ion implanted into the trench lower portion to form the p-type field relaxation layer 108 (not illustrated). The impurity concentration of the field relaxation layer 108 is $1\times10^{16}$ to $1\times10^{19}$ cm$^{-3}$, and the ion implantation energy ranges from 100 key to 1000 keV. The field relaxation layer 108 can be formed at a position farther away from the center of the trench lower portion by implanting these elements at such high energy. The distance is 0.05 to 0.5 μm. The high-energy ion implantation also widens the impurity distribution, and as a result the field relaxation layer 108 becomes wider than the resistance relaxation layer 109 formed after the field relaxation layer 108. The field relaxation layer 108 becomes 0.05 to 1 μm wider than the resistance relaxation layer 109.

Thereafter, with the hard mask in place, n-type impurities, N, and P are obliquely ion implanted into the trench lower portion to form the n-type resistance relaxation layer 109 that covers the trench lower portion (not illustrated). The impurity concentration of the n-type resistance relaxation layer 109 is $1\times10^{15}$ to $1\times10^{18}$ cm$^{-3}$. The resistance relaxation layer 109 covering the trench lower portion can be formed by performing the oblique ion implantation 4 times with a twist angle of 45, 135, 225, and 315 degrees at a 0 to 20 degree tilt angle. The ion implantation energy ranges from 5 keV to 300 keV. The low-energy implantation allows the resistance relaxation layer 109 to be formed between the trench lower portion and the field relaxation layer 108. The resistance relaxation layer 109 can also become narrower than the field relaxation layer 108. The impurity concentration of the resistance relaxation layer 109 is lower than that of the field relaxation layer 108, and is ⅕ of the impurity concentration of the field relaxation layer 108.

After removing the hard mask with hydrofluoric acid, a carbon (C) film is deposited on the front and back surfaces of the SiC epitaxial substrate 104 by using a plasma CVD method (not illustrated). The carbon (C) film has a thickness of 0.03 μm. With the front and back surfaces of the SiC epitaxial substrate 104 covered with the carbon (C) film, the SiC epitaxial substrate 104 is subjected to a heat treatment for 2 to 3 minutes at a temperature of 1500° C. or more. This activates the impurities ion-implanted into the SiC epitaxial substrate 104. After the heat treatment, the carbon (C) film is removed by an oxygen plasma treatment.

The gate insulating film 110 is then formed on the surface of the n$^-$-type drift layer 102 (not illustrated). The gate insulating film 110 is a silicon oxide (SiO$_2$) film formed by using a thermal CVD method. The gate insulating film 110 has a thickness of 0.05 to 0.15 μm.

Thereafter, an n-type polycrystalline silicon (Si) film 111 is deposited on the gate insulating film so as to fill the trench (not illustrated). The thickness of the n-type polycrystalline silicon film 111 is 0.25 to 1.5 μm, though it depends on the aperture width of the trench.

The polycrystalline silicon film 111 is then dry etched to form the gate electrode 111 (not illustrated).

After removing the fifth mask, an interlayer insulating film 112 (not illustrated) is formed on the surface of the n$^-$-type drift layer 102 so as to cover the gate electrode 111 and the gate insulating film 110, by using a plasma CVD method.

The interlayer insulating film 112 and the gate insulating film 110 are dry etched to form an aperture that reaches a part of the n$^+$-type source region 106, and the p$^+$-type potential fixing layer 107 (not illustrated).

Thereafter, the metal silicide layer 113 is formed on a part of the n$^+$-type source region 106, and on the p$^+$-type potential fixing layer 107 in the exposed surfaces at the bottom surface of the aperture (not illustrated).

The interlayer insulating film 112 is then dry etched to form an aperture that reaches the gate electrode 111 (not illustrated).

Thereafter, a laminate of a third metallization film, a titanium (Ti) film, a titanium nitride (TiN) film, and an aluminum (Al) film is deposited on the aperture that reaches the metal silicide film 113 formed on the surfaces of a part of the n+-type source region 106 and the p+-type potential fixing layer 107. The laminate is also deposited on the interlayer insulating film 112 including inside of the aperture (not illustrated) that reaches the gate electrode 111. The aluminum (Al) film has a thickness of preferably 2.0 μm or more. The third metallization film is then processed to form the source wire electrode 114 that is electrically connected to a part of the n+-type source region 107 and to the p+-type potential fixing layer 107 via the metal silicide layer 113, and the gate wire electrode (not illustrated) that is electrically connected to the gate electrode 111.

A passivation film 115 is then formed to protect the device. The passivation film 115 has a thickness of 2 to 10 μm, and is made of material such as silicon oxide and polyimide.

Thereafter, a second metalization film is deposited by sputtering on the back surface of the n+-type SiC substrate 101, though not illustrated. The second metallization film has a thickness of 0.1 μm.

This is followed by a laser annealing silicidation process, which, as shown in FIG. 22, causes a reaction between the second metallization film and the n+-type SiC substrate 101, and forms the metal silicide layer 116 so as to cover the n+-type drain region 103 formed on the back-surface side of the n+-type SiC substrate 101. The drain wire electrode 117 is then formed over the metal silicide layer 116. The drain wire electrode 117 has a thickness of 0.4 μm.

As described above, in Third Embodiment, the body layer 123 is provided at the lower portion of the body layer 105 of the trenched MISFET, as shown in FIG. 22. This makes it possible to further relax the applied OFF-time electric field to the gate insulating film 122, and realize the SiC power trenched MISFET having improved gate insulating film reliability.

REFERENCE SIGNS LIST

1: Semiconductor chip
2: Active region (device forming region)
3: FLR
4: Channel stopper
5: Gate wire electrode
6: Aperture
7: Source wire electrode
101: SiC substrate (substrate)
102: Drift layer
103: Drain region
105: p-Type body layer (well region)
106: Source region
107: Potential fixing layer
108: Field relaxation layer
109: Resistance relaxation layer
110: Gate insulating film
111: Gate electrode
112: Interlayer insulating film
113: Metal silicide
114: Source electrode
115: Passivation film
116: Metal silicide
117: Drain electrode
118: SiC substrate
119: Drift layer
120: n Drain region
122: Gate insulating film at trench bottom portion
123: Deep p-type body layer

The invention claimed is:

1. A silicon carbide semiconductor device comprising:
a first-conductivity-type substrate of silicon carbide having a first principal surface and a second principal surface opposite the first principal surface;
a first-conductivity-type drift layer of silicon carbide disposed on the first principal surface;
a second-conductivity-type body layer formed on the drift layer, the second conductivity type being different from the first conductivity type;
a first-conductivity-type source region that is in contact with the body layer;
a trench formed into the drift layer through the body layer;
a gate insulating film disposed on an inner wall of the trench;
a gate electrode that is in contact with the body layer via the gate insulating film;
a first-conductivity-type drain region disposed on the second principal surface of the substrate;
an electrical resistance relaxation layer that is in contact with the trench in the drift layer; and
an electrical field relaxation layer that is in contact with a part of a bottom portion of the electrical resistance relaxation layer, and is wider than the electrical resistance relaxation layer in a first direction along the first principal surface and extends for less than an entirety of a length of said first principal surface in the first direction,
wherein the electrical field relaxation layer is 0.05 to 1 μm wider than the first semiconductor region in the first direction.

2. The silicon carbide semiconductor device according to claim 1, wherein the electrical field relaxation layer has a higher impurity concentration than the electrical resistance relaxation layer.

3. A silicon carbide semiconductor device comprising:
a first-conductivity-type substrate of silicon carbide having a first principal surface and a second principal surface opposite the first principal surface;
a first-conductivity-type drift layer of silicon carbide disposed on the first principal surface of the substrate;
a second-conductivity-type body layer formed on the drift layer, the second conductivity type being different from the first conductivity type;
a first-conductivity-type source region that is in contact with the body layer;
a trench formed into the drift layer through the body layer;
a gate insulating film covering an inner wall of the trench;
a gate electrode that is in contact with the body layer via the gate insulating film;
a first-conductivity-type drain region disposed on the second principal surface of the substrate;
a first-conductivity-type first semiconductor region that is in contact with the trench in the drift layer, and that has a higher concentration of implanted impurities than the drift layer; and
a second-conductivity-type second semiconductor region that is in contact with the first semiconductor region, and is wider than the first semiconductor region in a first direction along the first principal surface and extends for less than an entirety of a length of said first principal surface in the first direction, wherein the second-conductivity-type second semiconductor region is 0.05 to 1 μm wider than the first semiconductor region in the first direction.

4. The silicon carbide semiconductor device according to claim 3, wherein the second semiconductor region has a higher impurity concentration than the first semiconductor region.

5. The silicon carbide semiconductor device according to claim 3, wherein the second semiconductor region is disposed 0.05 to 0.5 μm deeper than a lower portion of the trench.

6. The silicon carbide semiconductor device according to claim 3, wherein the first semiconductor region has an impurity concentration that is one fifth or smaller than the impurity concentration of the second semiconductor region.

7. The silicon carbide semiconductor device according to claim 3,
wherein a periphery portion of the first principal surface of the substrate is recessed, and the recessed portion has a termination structure, and
wherein the second semiconductor region is provided in an active region surrounded by the termination structure, and is absent in the termination of the periphery portion.

8. A method for producing a silicon carbide semiconductor device,
the method comprising the steps of:
(a) forming a third silicon carbide layer on a first principal surface of a first-conductivity-type first silicon carbide layer, the third silicon carbide layer being formed by implanting impurities of a second conductivity type different from the first conductivity type from a first principal surface side of an epitaxial substrate provided with a second silicon carbide layer of the first conductivity type having a lower concentration than the first silicon carbide layer, the impurities being implanted no deeper than the second silicon carbide layer;
(b) forming a fourth silicon carbide layer by implanting impurities of the first conductivity type from a first principal surface side of the third silicon carbide layer, the impurities being implanted no deeper than the depth of the impurities implanted in the step (a);
(c) forming a trench through the third silicon carbide layer into the fourth silicon carbide layer from a first principal surface side of the fourth silicon carbide layer;
(d) forming a fifth silicon carbide layer underneath the trench by implanting impurities of the second conductivity type from the first principal surface side of the third silicon carbide layer; and
(e) forming a sixth silicon carbide layer by obliquely implanting impurities of the first conductivity type between the fifth silicon carbide layer and the trench from a trench surface in the fourth silicon carbide layer,
wherein the fifth silicon carbide layer is wider than fourth silicon carbide layer in a first direction along the first principal surface and extends for less than an entirety of a length of said first principal surface in the first direction,
wherein the fifth silicon carbide layer is 0.05 to 1 μm wider than the first semiconductor region in the first direction.

9. The method according to claim 8, comprising the step of recessing a periphery of the silicon carbide semiconductor device before the step (a),
wherein the recess is deeper than the impurities of the second conductivity type implanted in the step (a) beneath a lower portion of the fifth silicon carbide layer.

10. The method according to claim 9, wherein a gate insulating film is formed after the step (e) that is thicker at a lower portion of the trench than at a side wall portion of the trench.

11. The method according to claim 8, wherein the fifth silicon carbide layer extends so as to overlap with an entirety of a bottom portion of said trench in the first direction.

12. The method according to claim 11, wherein the fifth silicon carbide layer extends so as to overlap with a part of a side wall of said trench.

13. The silicon carbide semiconductor device according to claim 1, wherein the electrical field relaxation layer extends so as to overlap with an entirety of a bottom portion of said trench in the first direction.

14. The silicon carbide semiconductor device according to claim 13, wherein the fifth silicon carbide layer extends so as to overlap with a part of a side wall of said trench.

15. The silicon carbide semiconductor device according to claim 3, wherein the second-conductivity-type second semiconductor region extends so as to overlap with an entirety of a bottom portion of said trench in the first direction.

16. The silicon carbide semiconductor device according to claim 3, wherein the fifth silicon carbide layer extends so as to overlap with a part of a side wall of said trench.

17. The method according to claim 8, wherein the trench has a depth of 0.5 to 3.0 μm.

18. The silicon carbide semiconductor device according to claim 1, wherein the trench has a depth of 0.5 to 3.0 μm.

19. The silicon carbide semiconductor device according to claim 3, wherein the trench has a depth of 0.5 to 3.0 μm.

* * * * *